United States Patent

Miley

[11] Patent Number: 5,949,244
[45] Date of Patent: Sep. 7, 1999

[54] LOW TOLERANCE PROBE CARD AND PROBE RING SYSTEMS

[76] Inventor: David M. Miley, 2600 Renner Rd., Apt. 228, Richardson, Tex. 75082

[21] Appl. No.: 08/582,296

[22] Filed: Jan. 3, 1996

[51] Int. Cl.$^6$ .................................................... G01R 31/02
[52] U.S. Cl. ............................................ 324/762; 324/758
[58] Field of Search ..................................... 324/754–769

[56] References Cited

U.S. PATENT DOCUMENTS

| | | |
|---|---|---|
| 3,806,801 | 4/1974 | Bove . |
| 3,866,119 | 2/1975 | Ardezzone et al. ..................... 324/754 |
| 3,911,361 | 10/1975 | Bove et al. . |
| 4,161,692 | 7/1979 | Tarzwell . |
| 4,719,417 | 1/1988 | Evans . |
| 4,757,256 | 7/1988 | Whann et al. ........................... 324/758 |
| 4,780,670 | 10/1988 | Cherry . |
| 4,837,622 | 6/1989 | Whann et al. . |
| 4,965,865 | 10/1990 | Trenary .................................... 324/754 |
| 4,983,907 | 1/1991 | Crowley . |
| 5,075,621 | 12/1991 | Hoyt . |
| 5,101,149 | 3/1992 | Adams et al. . |
| 5,172,051 | 12/1992 | Zamborelli . |
| 5,416,429 | 5/1995 | McQuade et al. ....................... 324/762 |

*Primary Examiner*—Josie Ballato
*Assistant Examiner*—Russell M. Kobert
*Attorney, Agent, or Firm*—R. Darryl Burke; McKool Smith, P.C.

[57] ABSTRACT

An apparatus to test an integrated circuit has a plurality of contact pads electrically coupled to the integrated circuit to transfer electrical signals to and from the integrated circuit. The apparatus comprises a ring and a plurality of probes. The ring has a ring surface and an opening to a hollow cavity extending through the ring. The ring surface substantially surrounds the opening. The ring has at least one structural reference point affixed thereto, which is offset a known distance and a known direction from the plurality of contact pads. The plurality of probes are positioned on the ring surface extending from a first location exterior to the ring to a second location proximate to the opening. The plurality of probes are affixed to the ring surface, each probe of the plurality of probes having a contact end to contact one contact pad of the plurality of contact pads, each probe of the plurality of probes aligned in such a way so as to orientate each contact end of each probe of the plurality of probes over the opening to contact one contact pad of the plurality of contact pads. Each probe of the plurality of probes aligned in a known relationship from the at least one structural reference point. A process comprises the following steps of creating a plurality of probe guide holes and a plurality of template alignment holes in a film template in a known relationship with one another; affixing and aligning the film template to a fixture; inserting a plurality of probes in the plurality of probe guide holes of the film template; aligning and fitting a probe ring to the fixture; affixing the plurality of probes to the probe ring; and removing the probe ring having the plurality of probes affixed thereto.

31 Claims, 12 Drawing Sheets

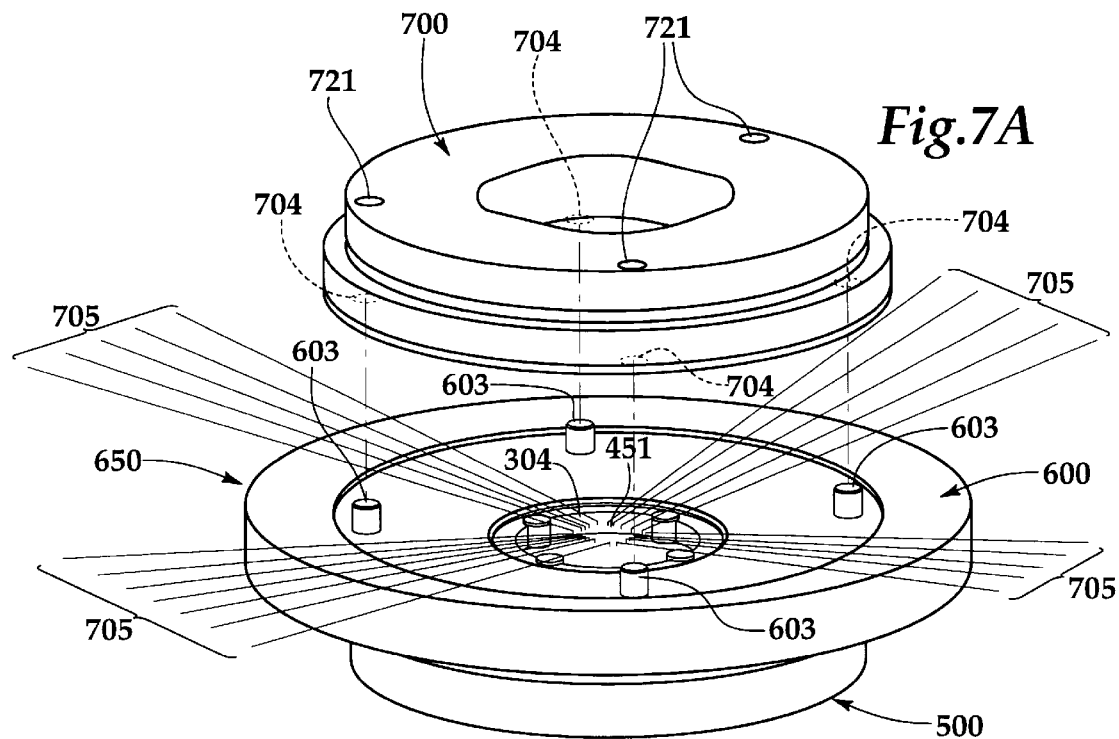
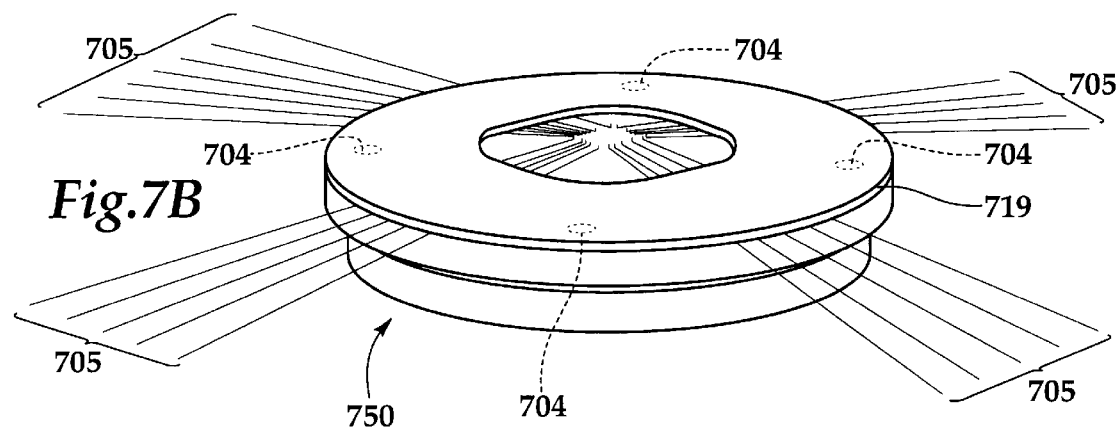
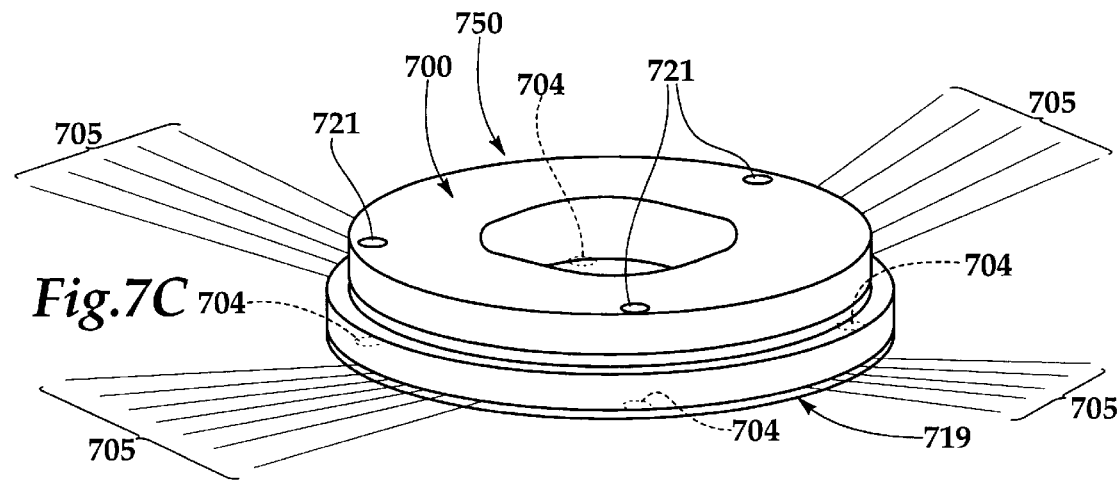

LOW TOLERANCE PROBE CARD AND PROBE RING SYSTEMS

PARTIAL WAIVER OF COPYRIGHT PURSUANT TO 1077 O.G. 22 (Mar. 20, 1987)

® Copyright, David Miley 1996. All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright rights has no objection to the facsimile reproduction by anyone of the patent document or patent disclosure, as it appears in the United States Patent and Trademark Office patent file or records, but otherwise reserves all copyright rights whatsoever.

FIELD OF INVENTION

The present invention generally relates to the field of testing equipment for integrated circuits mounted on a semiconductor substrate and, particularly, to probe cards used by various types of testing equipment to test unsevered integrated circuits formed on a semiconductor substrate generally in wafer form and related methods to use the present invention and to manufacture the present invention.

BACKGROUND

Distinct semiconductor integrated circuits or microchips (or chips) are generally manufactured on a single wafer of semiconductor material (e.g., silicon). These individual microchips are later cut out of the wafer. Each microchip has contact pads that are electrically coupled to the electrical circuitry embedded therein. While the contact pads are exposed in wafer or microchip form, which is before the microchips are packaged, a selected number of microchips are tested by automated test equipment that utilize probe rings and probe cards to test the microchips to ensure they meet design specifications.

Referring to FIG. 1, a probe card assembly 50 generally consists of printed circuit board 10 that has central opening 11 which provides access to the microchip 20 to be tested, together with a series of spaced conductive individual flexible metallic needles or blades (probes) 12 arranged on a metal or ceramic probe ring 13 around central opening 11. Each probe 12 extends away from printed circuit board 10 toward the center of central opening 11. Probes 12 are adapted to electrically contact selected parts on the microchip 20 being tested (e.g., contact pads) which are electrically coupled to the rest of the integrated circuitry embedded in the microchip 20, so that electrical signals may be transmitted to and from the microchip 20 being tested. These signals transmit test routines that test the functionality of circuits and subcircuits of the overall integrated circuit embedded in the microchip 20.

A traditional method used throughout the industry for positioning probes 12 in the required position on metal (or ceramic) probe ring 13 uses a film template, which generally consists of Mylar™, to fix the position of probes 12 in relation to the desired position on probe ring 13. Holes are typically drilled or punched in the template in a pattern that generally coincides with the location of the target area of contact pads of the microchip 20 to be tested. The bent tip of a probe 12 is then inserted into each hole after which probe ring 13 is bonded to the arrayed probes by means of an epoxy cement, which forms a single probe ring assembly 50. Probe ring assembly 50 is affixed to central opening 11 of printed circuit board 10 with cement and each probe 12 is soldered to a specified contact on the printed circuit board 10. Probe tips of probes 12 are then sanded to achieve a uniform length. Each probe 12 is then aligned (also known as "X-Y" positioning), so that it generally contacts the target area of the specified microchip 20 contact pad. Each of these steps are typically performed by hand.

Since all of the contact pads must be simultaneously engaged in order to carry out testing operations, it is essential that all of the probe tips of probes 12, electrically contact its target contact area(s) at the same time. In addition, since all of the contact pads generally lie in a common geometric plane, it is essential that the probe tips of probes 12 lie in a plane parallel to the common microchip plane of microchip 20. Consequently, a fundamental requirement of probe card assembly 50 is planarization (also known as "Z" or height positioning) of the probe tips. The nature of conventional probe card assemblies 50 and the character of the assembly fixtures for setting up the positions of probes 12 for such probe cards assemblies 50 are such that it is virtually impossible to assemble probes 12 with probes 12 lying exactly in the same plane. There are simply too many variables to control in existing manufacturing processes, especially in manufacturing processes that consist of numerous of steps that are performed by hand. These variables reduce the quality of the product as well as inhibit the development of an automated approach. In short, in light of the small tolerances involved with manufacturing probe rings 13 and probe card assemblies 50, slight errors and variances produced by steps performed by hand become major problems.

In addition to the well recognized need for accurately positioning each probe card assembly 50 on specified X, Y and Z axes with respect to the target contact pads on the microchip 20, there is an additional need for exact alignment of probe card assembly 50 on a specific rotational or theta (θ) axis. In particular, probe card assembly 50 is designed and built not only to test specified circuits and subcircuits on a microchip; it is also designed to be installed on and be used with automated test equipment. The construction of certain automated test equipment is generally such that probe card assembly 50 is fit to a component of the automated test equipment designed to allow for small rotational theta (θ) adjustments in the positioning of probe card assembly 50. Ideally, each probe card assembly 50 built for a given type automated test equipment would fit to that particular piece of automated test equipment in such a manner that the probe tips of each probe 12 of each probe card assembly 50 of a given design would engage the target areas of the contact pads of microchip 20 in precisely the same location, thereby requiring no adjustment when installing a new card 50. When this is not the case, the automated test equipment operator must manually adjust the orientation of the probe card assembly 50 by something on the order of two to fifteen degrees on the theta (θ) axis each time a new probe card is installed. This results in lost production each time a probe card assembly 50 is changed and adjusted. In addition, existing manufacturing methods are unable to reliably and uniformly replicate the X-Y positioning of each probe card component in relation to every other component, or in relation to the target pads on the microchip, for a card of a given design. Positioning of component to component in the manufacturing process is largely a subjective matter varying from technican to technician and from time to time. As a result, while more modern probers may, in some situations, perform the wafer to probe card alignment automatically (and fairly rapidly), there is still a time penalty associated with the use of traditional probe cards, such as probe card assembly 50, because of an inability of the industry to replicate the manufacture probe cards assemblies 50 having low rotational (or theta axis) and/or x-y, tolerance.

SUMMARY

The disclosed invention(s) pertain to an apparatus that is used to test an integrated circuit and methods to manufacture the apparatus(s) used to test integrated circuits. An integrated circuit generally is comprised of a plurality of contact pads that are electrically coupled to the integrated circuit to transfer electrical signals to and from the integrated circuit. Preferred embodiments of the probe ring generally comprise a ring and a plurality of probes. The ring, which is preferably non-conductive and substantially circular, has a ring surface and an opening to a hollow cavity extending through the ring. The ring is comprised of materials selected from the group consisting of ceramic, anodized aluminum, fiberglass, metal, and any combination thereof. Rings in some preferred embodiments are comprised of a first part and a second part that interlock with one another. A ring surface substantially surrounds the opening and has at least one structural reference point attached (e.g., pins, holes, and/or pin/hole combinations). The structural reference point(s) is(are) a known distance and a known direction from the plurality of contact pads. In addition, the structural reference point(s) is(are) offset a known distance from the overall reference point or origin, so that the position of each contact end of each probe of the plurality of probes and the position of each contact pad of the integrated circuit to be tested when proximate to the non-conductive fixture are known in relation to the origin. The plurality of probes are positioned on the ring surface and extend from a location exterior to the ring and is located proximate to the opening. The plurality of probes are attached to the ring surface. Each probe has a contact end to contact one contact pad of the plurality of contact pads. Each probe is aligned in such a way so as to orient each contact end of each probe of the plurality of probes over the opening to contact a corresponding one contact pad. Each probe is aligned in a known relationship from at least one structural reference point. Each probe is aligned by inserting the contact end through a respective guide hole in the film template. The film template is aligned to the ring to secure each guide hole of the plurality of guide holes in a proper position.

Preferred embodiments of the probe ring may be placed in an opening of a printed circuit board. The opening of the printed circuit board is generally referred to as the second opening. The second opening has an opening perimeter and a plurality of electrical contacts that contact the plurality of probes. This plurality of electrical contacts selectively electrically couple the plurality of probes with testing equipment to test integrated circuit. The opening in probe ring has an opening perimeter. Note printed circuit board and the probe ring are aligned with one another. The plurality of probes is affixed to the ring surface with an adhesive (e.g., epoxy). The adhesive electrically insulates the plurality of probes from one another. The ring is preferably comprised of a stable, machinable (and/or pottable), non-conductive material. The ring is preferably comprised of materials selected from a group consisting of ceramic, plated metal, plastic, epoxy, glass or any combination thereof.

Preferred embodiments of the ring have a first plurality of ring alignment holes that accept a plurality of ring drop mold surface alignment pins that extend from a ring drop mold surface of a ring drop mold. The ring drop mold secures a film template in place. The film template has a plurality of probe guide holes and a plurality of film template alignment holes. The film template alignment holes are at a known offset from the structural reference point and/or from the origin. The plurality of probe guide holes are at a known offset from the reference point and the probe guide holes secure the plurality of probes in position while each probe of the plurality of probes is being affixed to the ring surface.

Preferred embodiments of the ring drop mold are comprised of a first part and a second part that interlock with one another. The first part has a second ring drop mold surface and a plurality of ring drop mold alignment holes. The second part of the ring drop mold has a plurality of ring alignment pins. The alignment pins of the second part extend into the alignment holes of the first part. The alignment holes or pins independently or together constitute at least one structural reference point. Note, however, other structural reference points are possible.

The accuracy and tolerance of the manufactured apparatus are further determined through the use of ring alignment base plate assembly and printed circuit board alignment plate to assemble the preferred embodiment. The ring alignment base plate assembly interlocks with printed circuit board alignment plate. The printed circuit board is secured into a first appropriate position by the printed circuit board alignment plate. The ring is secured in a second appropriate position in relation to the first appropriate position by the ring alignment base plate assembly. Preferred embodiments of the ring alignment base plate assembly have a plurality of ring alignment plate pins that interlock with a plurality of printed circuit board alignment plate holes in the printed circuit board alignment plate. The ring alignment base plate assembly also has a plurality of ring alignment drum control pins that align and interlock with a plurality of alignment holes in ring.

Preferred methods of manufacturing the preferred embodiments described above comprise the following steps: (a) creating a plurality of probe guide holes and a plurality of template control holes in film template in a known relationship with one another; (b) affixing and aligning the film template to a fixture, such as a ring drop drum and ring drop mold of ring drop base assembly; (c) inserting a plurality of probes in the probe guide holes of the film template; (d) aligning and fitting probe ring to ring; (e) affixing the plurality of probes to the probe ring; and (f) removing the probe ring having the plurality of probes affixed thereto.

Step (a) may comprise the following substeps: (a1) creating the plurality of probe guide holes in said film template and then (a2) creating the plurality of template control holes. Step (a) may comprise (a1) creating the plurality of template control holes in a film template by (i) providing a drill alignment die and a drill alignment die guide, the drill alignment die and the drill alignment die guide interlock with one another, with the drill alignment die guide having a plurality of die guide holes and drill alignment die having a plurality of die base guide pins; (ii) fixing the film template to the drill alignment die; (iii) coupling the drill alignment die with the film template to drill alignment die guides to secure the film template in place in relation to the plurality of template guide holes; and (iv) inserting at least one template into the plurality of template guide holes to create a plurality of template control holes; and (a2) creating the plurality of probe guide holes in the film template by (i) aligning, fitting, and affixing the film template to drill alignment guide fixture; and (ii) drilling the plurality of probe guide holes in the film template. The plurality of probe guide holes are in a known relationship with the plurality of template control holes.

Step (b) may also comprise the following substeps: (b1) aligning and affixing the film template having a plurality of template control holes and a plurality of probe guide holes to the ring drop drum of ring drop base assembly, a ring drop drum upper surface of ring drop drum having a plurality of drum alignment pins that extends away from the ring drop drum and align with and extend into the plurality of template control holes when the film template is properly aligned with the ring drop drum upper surface of the ring drop drum; and (b2) aligning and fitting ring drop drum upper surface, the ring drop mold having a plurality of ring drop guide holes in which the plurality of ring drop guide pins fit when the ring drop mold and the ring drop base assembly are properly aligned.

Preferred processes may also be comprised of the following steps: (g) providing a printed circuit board with a printed circuit board opening therein, the probe ring having a perimeter, the printed circuit board opening conforming with the perimeter of the probe ring; (h) aligning the probe ring with the printed circuit board opening in the printed circuit board; and (i) fitting the probe ring inside the printed circuit board opening of the printed circuit board. In addition, the preferred processes may also comprise: (j) providing a ring alignment base plate assembly comprising a ring alignment plate and a ring alignment base with attached ring alignment drum, and a printed circuit board alignment plate; (k) aligning and fitting the printed circuit board to a printed circuit board alignment plate; (l) aligning the probe ring to the alignment guide plate; (m) mounting and securing the probe ring to the printed circuit board to create a probe card assembly; and (n) sanding each tip of each probe of the plurality of probes to an appropriate amount and soldering each probe of the plurality of probes to selected contact areas of the printed circuit board.

The preferred process may further comprise the following steps: (o) aligning and fitting template alignment holes to a probe alignment base plate; (p) mounting the probe alignment base plate to X-Y stage fixture; (q) aligning and fitting the probe card assembly to the probe ring alignment plate; (r) mounting the probe ring alignment plate with the probe card assembly to X-Y stage fixture; (s) aligning and fitting probe ring alignment plate to probe alignment base plate; and (t) verifying alignment of each probe of the plurality of probes to a corresponding probe target hole.

Preferred embodiments provide a number of advantages. For instance, preferred embodiments reliably and uniformly manufacture multiple probe card assemblies of a given design, each having nearly identical alignment (X-Y) characteristics. In addition, preferred embodiments repeatedly position each major component of a probe card assembly of a given design in a nearly identical position relative to every other major component so that each card assembly of that design will be nearly identical on the X, Y within a maximum tolerance of ±0.002 inches and theta (θ) axes within a tolerance of ±10 arc seconds. A significant feature (and advantage) of the invention is the use of a variety of assembly fixtures (e.g., die, jigs, templates), each incorporating a series of fixed alignment pins and/or holes, to align one probe card assembly component to another, and ultimately align each probe on each probe card assembly to its target pad on the microchip, so that the probe ring assemblies and probe card assemblies can be manufactured more rapidly and reliably in high volume. All of these features provide significant monetary savings in the costs associated with the manufacturing process of the probe ring assemblies and probe card assemblies as well as of microchips themselves. These savings ultimately reduce costs for customers and consumers. In particular, the invention(s) discussed below provide a substantial savings in manufacturing time (e.g., savings of 20% in build time, 90% in setup time). Similarly, the invention(s) discussed below provide a substantial savings in manufacturing time for customers, because the probe ring assemblies and probe card assemblies are significantly more accurate and therefore require significantly less manual and/or mechanical alignment adjustments.

Other advantages of the invention and/or inventions described herein will be explained in greater detail below.

BRIEF DESCRIPTION OF THE DRAWINGS

The accompanying drawings are incorporated into and form a part of the specification to illustrate several examples of the present inventions. These drawings together with the description serve to explain the principles of the inventions. The drawings are only for the purpose of illustrating preferred and alternative examples of how the inventions can be made and used and are not to be construed as limiting the inventions to only the illustrated and described examples. Further features and advantages will become apparent from the following and more particular description of the various embodiments of the invention, as illustrated in the accompanying drawings, wherein:

FIG. 7A is a perspective view of probe ring 700 being aligned to ring drop mold 600 (which was mounted to base 500 in FIG. 6A) after tips of probes 705 have been inserted through probe guide holes 451 in Mylar™ film template 304;

FIGS. 7B and 7C are perspective views of probe ring assembly 750 created using the preferred process;

DETAILED DESCRIPTION OF THE PREFERRED EMBODIMENT

Figure 1:
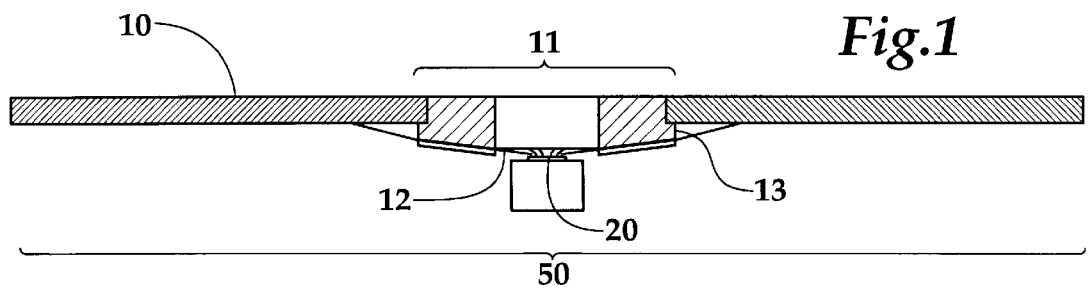
FIG. 1 illustrates cross section of conventional epoxy ring probe card assembly 50, which consists of printed circuit board 10 having central opening 11 that provides access to the chip to be tested, together with a series of spaced conductive individual flexible metallic needles or blades (probes) 12 arranged on a metal or ceramic probe ring 13 around central opening 11.

The present inventions will be described by referring to apparatus and methods showing various examples of how the inventions can be made and used. When possible, like reference characters are used throughout the several views of the drawing to indicate like or corresponding parts.

FIG. 1 illustrates cross section of conventional epoxy ring probe card 50 which consists of printed circuit board 10 having central opening 11 which provides access to the microchip 20 to be tested, together with a series of spaced conductive individual flexible metallic needles or probes 12 arranged on a metal or ceramic probe ring 13 around central opening 11. As discussed above, the positioning of probes 12 of conventional probe cards 50 is problematic. Moreover, even when extreme care is exercised during existing manufacturing processes to maintain a high degree of precision of positioning probes 12 on probe ring 13, which are extremely time consuming and therefore prohibitive in terms of cost, there are still errors, especially from one probe card to another probe card.

Figure 2A:
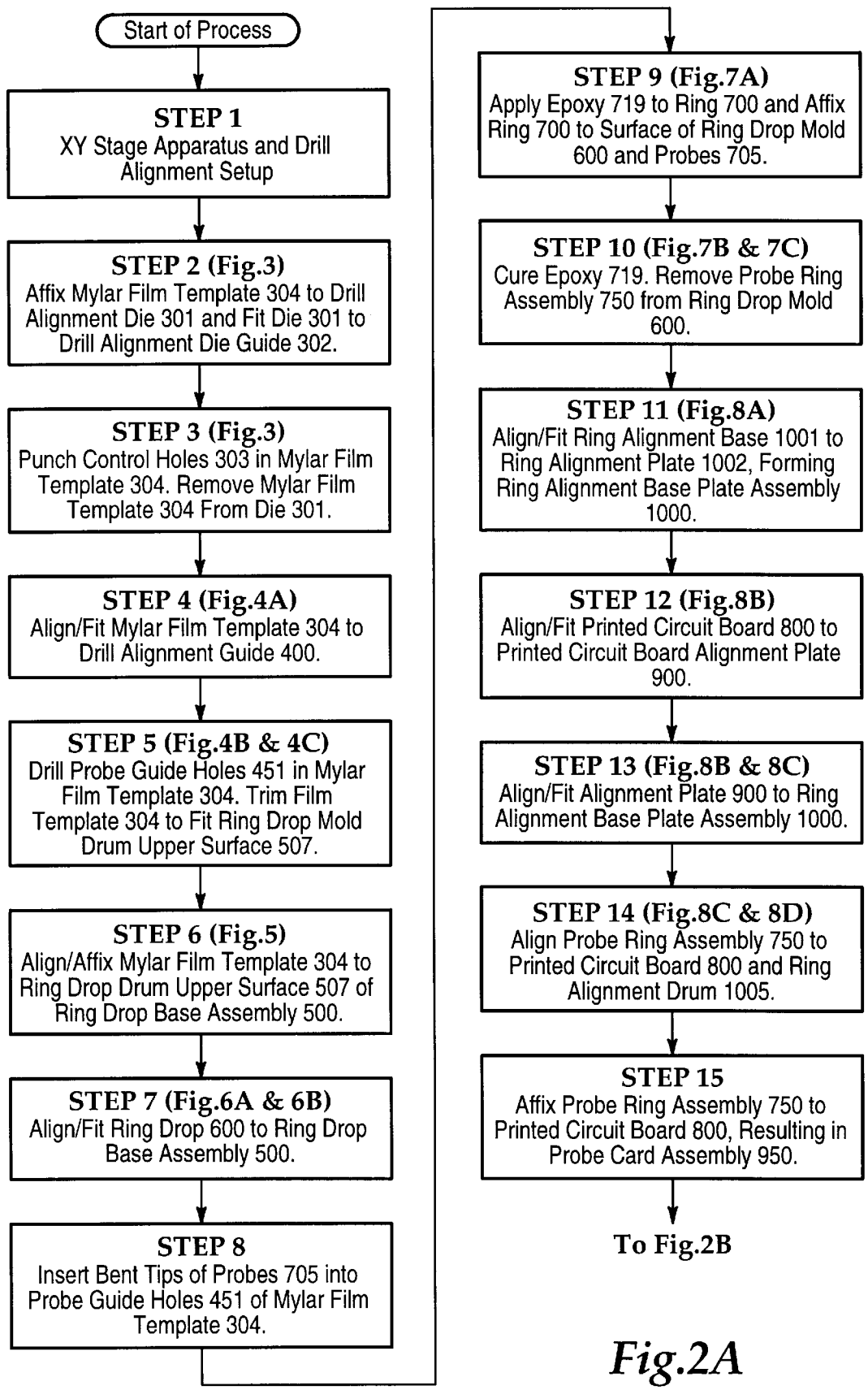
FIGS. 2A and 2B illustrate a flow chart of the preferred process used to manufacture the preferred embodiment of low tolerance probe card 20 (in FIGS. 9A–9C)
Figure 2B:
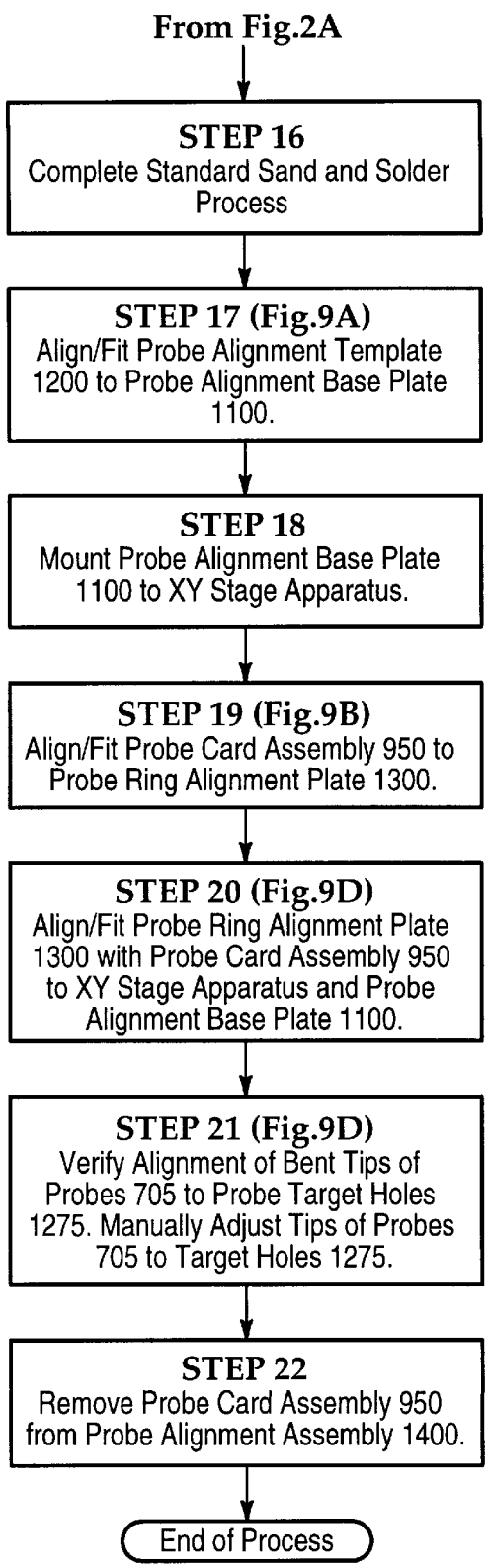
Figure 8A:
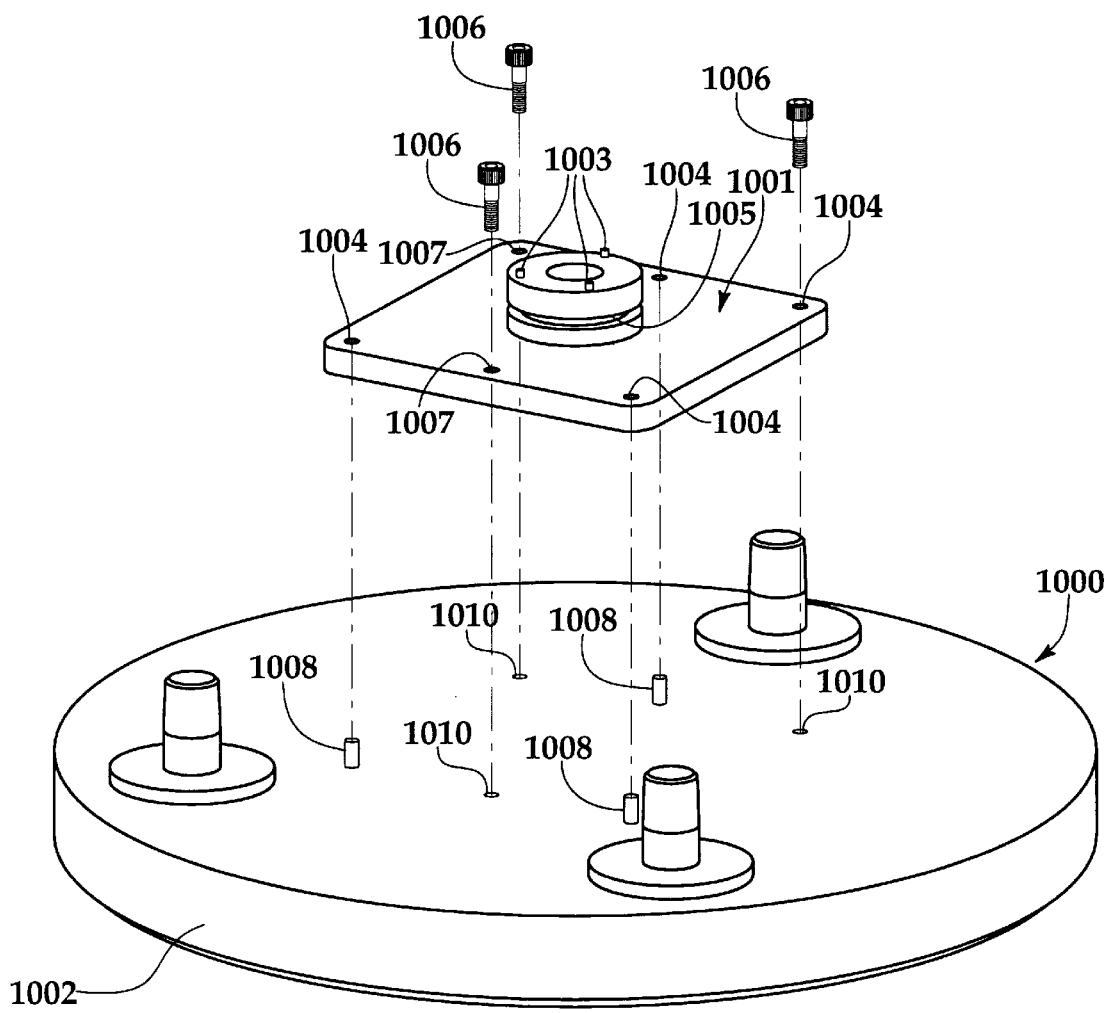
FIG. 8A is a perspective view of ring alignment base 1001 being affixed to ring alignment plate 1002 to form ring alignment base plate assembly 1000.
Figure 8B:
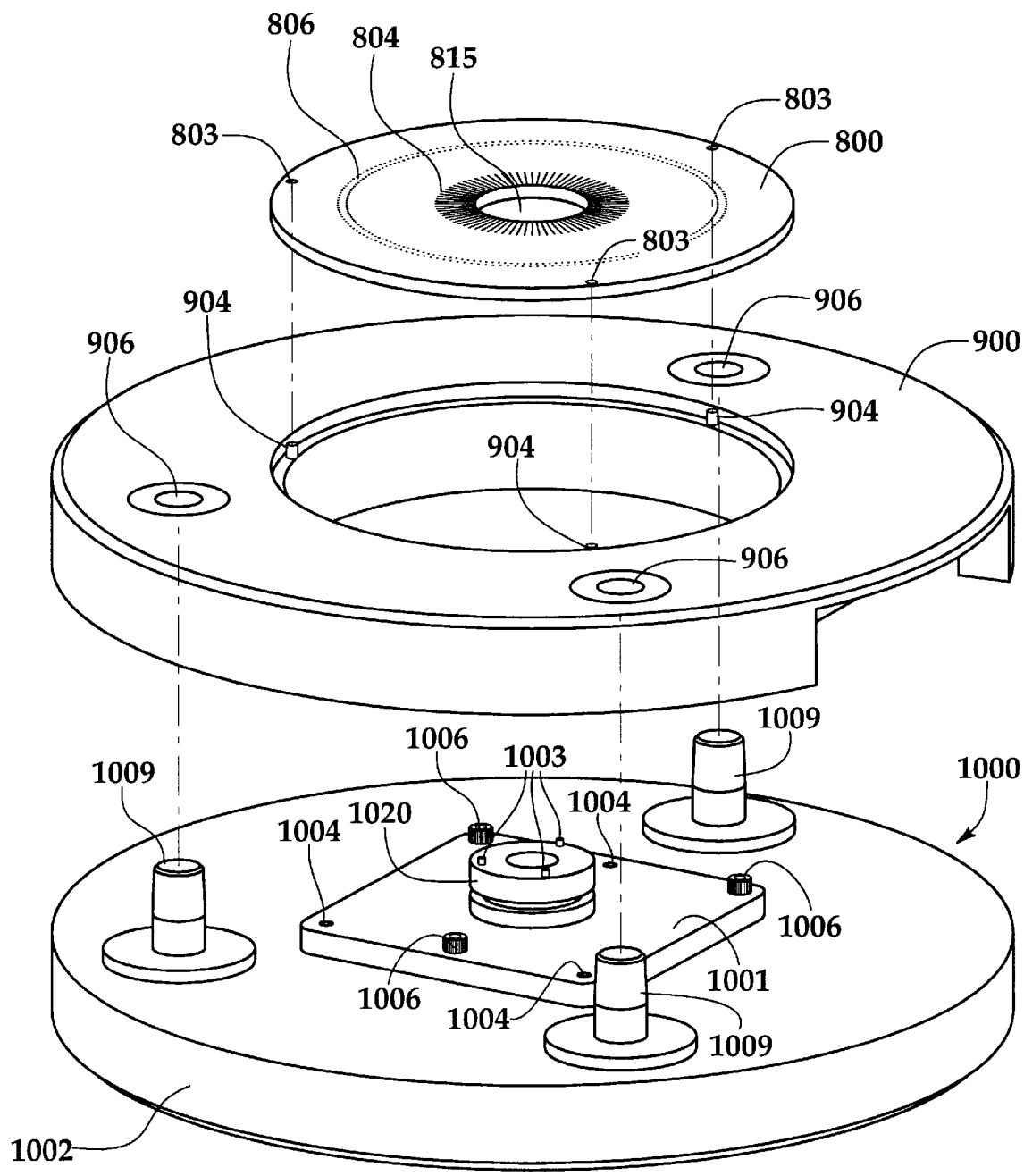
FIG. 8B is a perspective view of printed circuit board 800 being aligned to printed circuit board alignment plate 900 and of printed circuit board alignment plate 900 being aligned to ring alignment base plate assembly 1000.
Figure 8C:
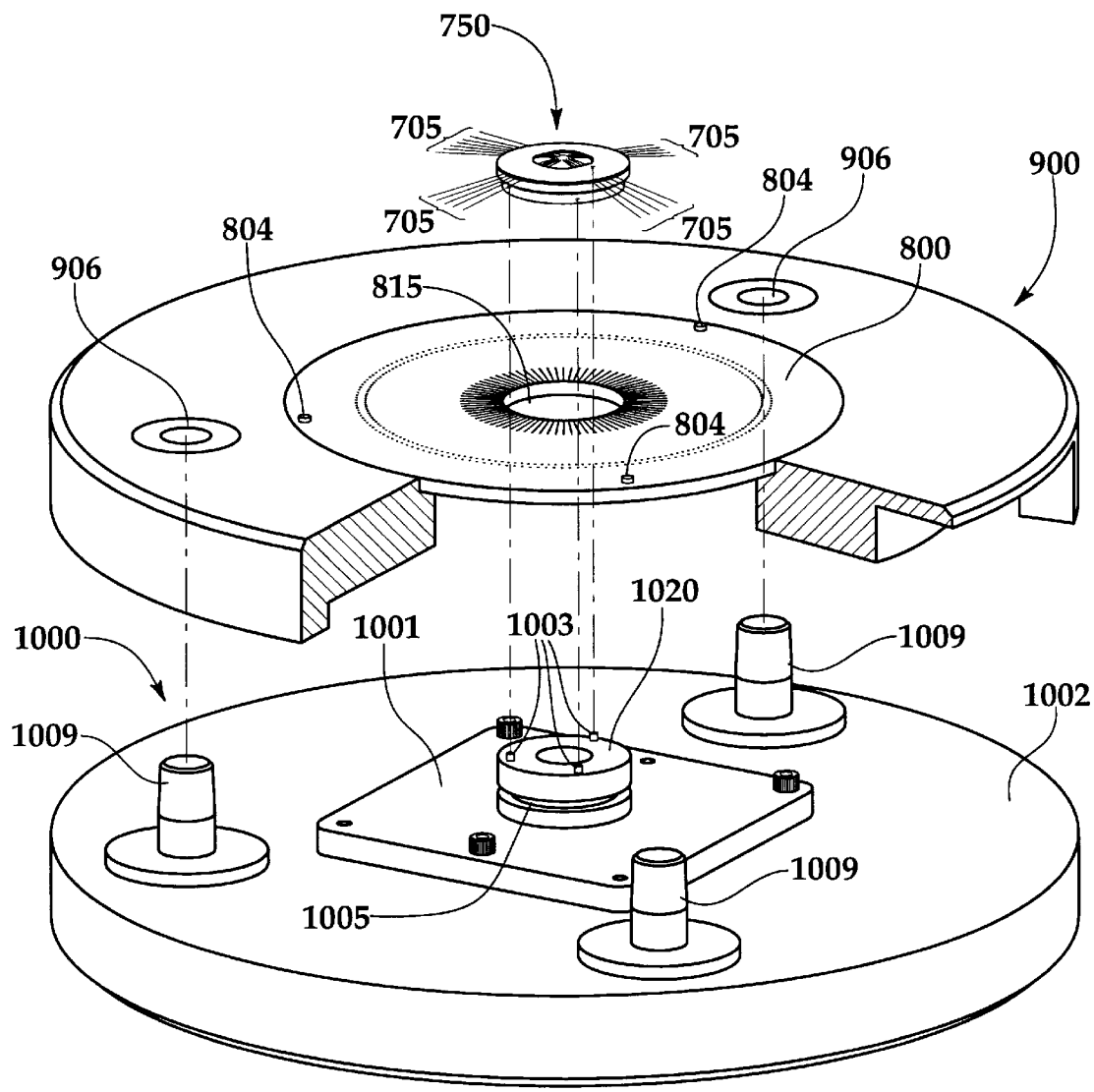
FIG. 8C is a perspective view of probe ring 750 being aligned to printed circuit board 800 while printed circuit board alignment plate 900 is being aligned and assembled to ring alignment base plate assembly 1000.
Figure 8D:
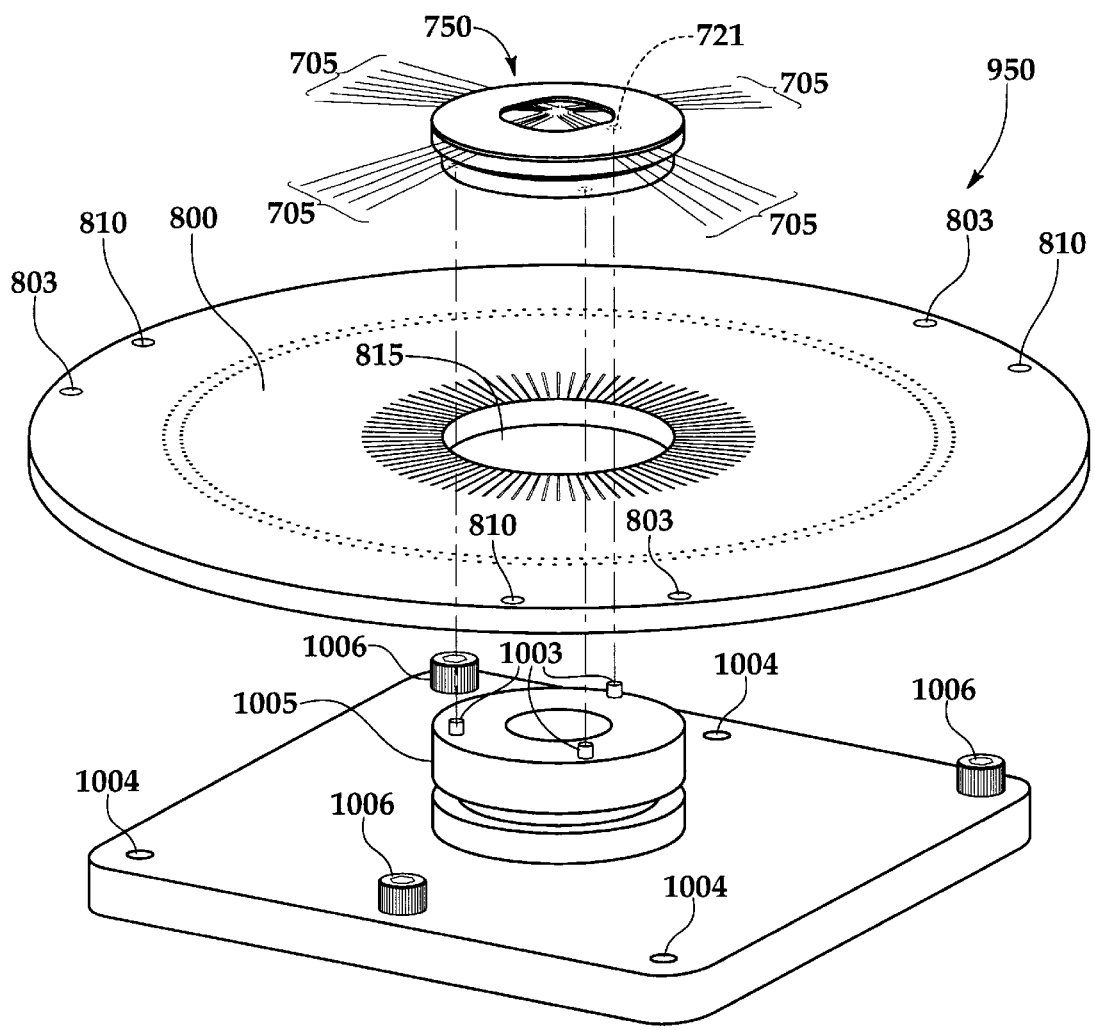
FIGS. 8D and 8E are perspective views of printed circuit board 800 combined with probe ring assembly 750 to form preferred probe card 950.
Figure 8E:
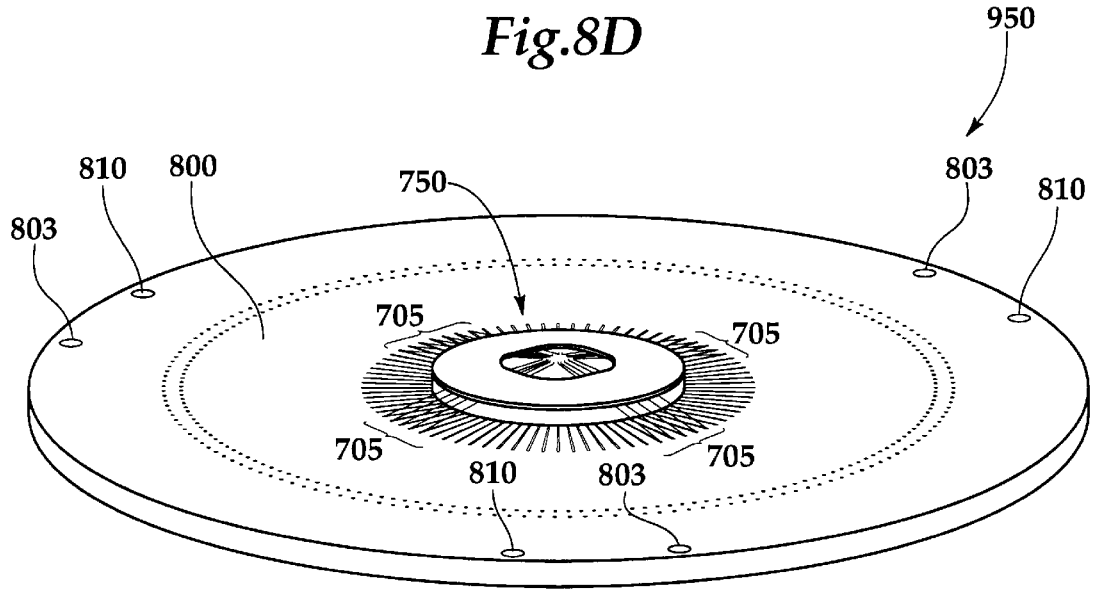

FIG. 2 illustrates a flow chart of preferred process used to manufacture the preferred embodiment of probe card assembly 950 (in FIG. 8E). Preferred processes to manufacture the probe card assembly 950 are comprised of the following steps: (1) X-Y stage alignment setup; (2) affix Mylar™ film template 304 to drill alignment die 301 (in FIG. 3); (3) punch guide holes 303 in Mylar™ film template 304 by inserting punch 330 through punch alignment holes 305 of drill alignment die guide 302 and drill alignment die 301 (in FIG. 3); (4) align, fit, and affix Mylar™ film template 304 to drill alignment guide 400 (in FIG. 4A); (5) drill or punch probe guide holes 451 in Mylar™ film template 304 (in FIGS. 4B and 4C); (6) align, trim, and fit Mylar™ film template 304 onto ring drop mold base 500 (in FIG. 5); (7) align and fit ring drop mold 600 to ring drop base assembly 500 (in FIGS. 6A and 6B); (8) insert probes 705 in probe guide holes 451 of Mylar™ film template 304; (9) align and fit probe ring 700 to ring drop mold surface 602 (in FIG. 7A); (10) complete ring drop process (e.g., using the standard ring drop process) (in FIGS. 7B and 7C); (11) align and fit ring alignment plate 1001 to ring alignment base plate 1002 (in FIG. 8A); (12) align and fit printed circuit board 800 to printed circuit board alignment plate 900 (in FIG. 8B); (13) align probe ring 700 to ring alignment drum upper surface 1020 of ring alignment base 1001 (in FIGS. 8C and 8D);
(14) align and mount probe ring assembly 750 to printed circuit board 800 (in FIG. 8C); (15) affix probe ring assembly 750 to printed circuit board 800, resulting in probe card assembly 950 (in FIG. 8E); (16) complete said tips of probes 705 to the appropriate amount and solder probes 705 to selected contact areas of printed circuit board 800 (in FIG. 8E); (17) align and fit probe alignment template 1200 to probe alignment base plate 1100 (in FIG. 9A); (18) mount probe alignment 1100 to X-Y stage (in FIG. 9A); (19) align and fit finished probe card (probe ring 700 with probes 705 assembled to printed circuit board 800) to probe ring alignment plate 1300 (in FIG. 9B); (20) fit, align, and mount probe alignment plate 1300 with probe card assembly 950 to X-Y stage (in FIG. 9D); (21) verify alignment of probe needles 705 to probe target holes 1275 (in FIG. 9D) and manually adjust tops of probes 705 to target holes 1275 and (22) remove probe card assembly 950 from probe alignment assembly 1400. Note that the above steps do not necessarily need to be performed in order. For instance, the X-Y stage alignment setup could be performed after step 2 or step 3, so long as it is competed by step 4. Similarly, it is conceivable that some of the alignment steps could be combined to reduce the total alignment time, so long as the relationship between the alignment holes 303 and pins used to align (and realign) alignment holes 303 of Mylar™ film template 304 is known and continuously taken advantage of to ensure accuracy. Similarly, step 14 can be performed before or simultaneously with Step 13. In addition, note the appropriate lengths of probes 705, actual number of probes 705, actual position of probes 705, etc. will vary from job to job and work assignment to work assignment in relation to the microchip the probe ring and/or probe card is intended to test. Also, note that the steps recited above can be interrupted at any stage and at any step to insert additional steps and/or to provide a product at any stage of completion. For instance, probe ring 700 with probes 705 attached (completed by step 10) can be provided independent from printed circuit board 800 (completed after step 21).

The preferred processes may also be comprised of the additional step of completing the ring drop process and may use the commonly used standard ring drop process. The standard ring drop process is generally comprised of the following steps: (g) drilling or punching the film template, (h) affixing the film template to the ring drop drum, (i) trimming the film template to match the outside diameter of the ring drop drum, (j) joining the ring drop base assembly and ring drop mold, (k) applying mold release to the ring drop mold surface of ring drop mold, (l) inserting probes through probe guide holes, (m) fanning the plurality of probes so that they do not touch each other and contact the appropriate trace on printed circuit boards, (n) applying an adhesive to the probe ring, (o) dropping probe ring on top of each probe and sandwiching them between probe ring and ring drop mold surface of ring drop mold, (p) rotating and moving the probe ring in an X-Y direction by hand to a location that is equidistant from the probe guide holes (and verifying their placement), (q) baking the entire assembly at the appropriate temperature to cure the adhesive, and (r) removing the finished probe ring assembly that comprises probe ring and probes. The film template is affixed to the ring drop drum by punching or drilling a probe guide hole pattern in the film template that is positioned, so that each side is equidistant (depending upon the pattern of the contact pads of the microchip) from the center in reference to the opposite side (which is not necessarily an adjacent side) and verifying.

Figure 3:
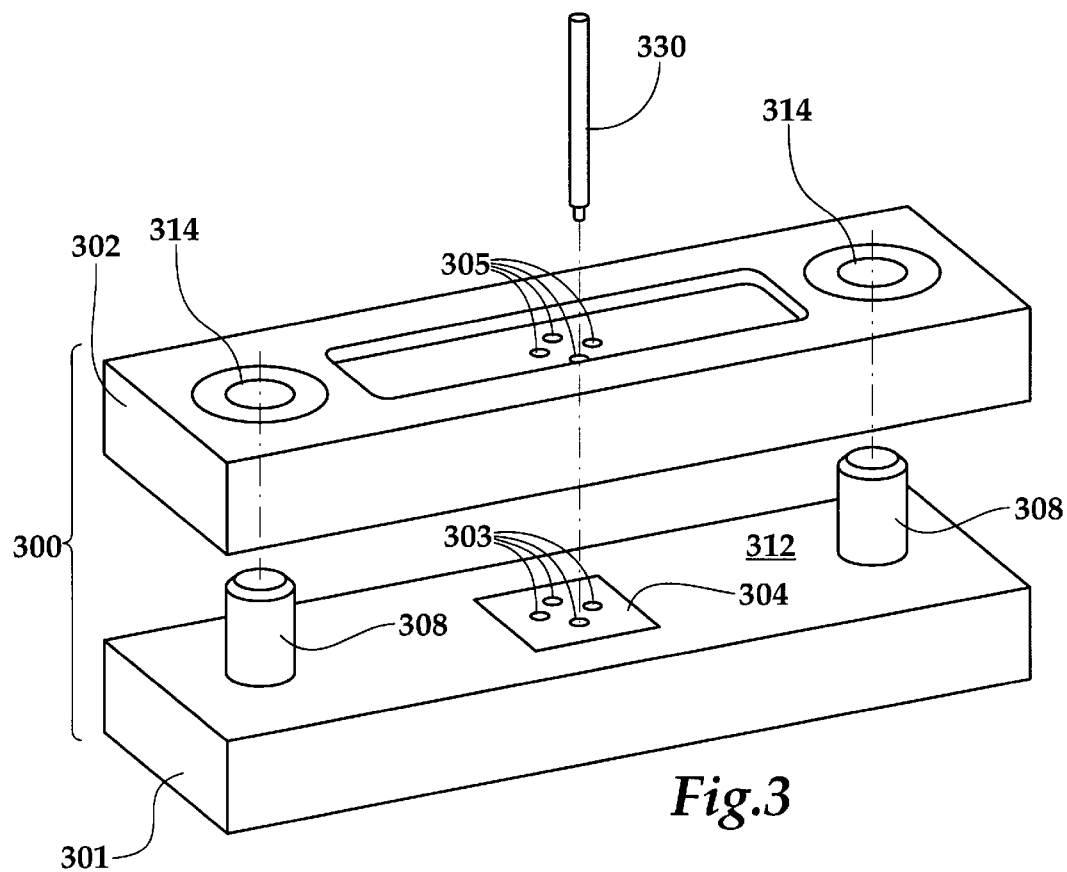
FIG. 3 is a perspective illustration of drill alignment die 302 and die base 301, which are used to punch a plurality of alignment control holes 303 in Mylar™ film template 304.

FIG. 3 is a perspective illustration of drill alignment die guide 302 and drill alignment die 301, which are used to punch or drill at least one template control hole 303 in Mylar™ film template 304, preferably a plurality of template control holes 303. Drill alignment die 301 has die base guide pins 308 extending away from die base surface 312. Die base guide pins 308 are pressed and fit into drill alignment die 301. Die base guide pins 308 slip into die guide holes 314 to properly align drill alignment die guide 302 and drill alignment die 301 to ensure reliable, repeatable, consistent, and virtually identical positioning of the Mylar™ film template 304 on drill alignment guide 400 (shown in FIG. 4A). The alignment achieved at this stage in the process also acts to ensure subsequent alignment of other fixtures used in the manufacturing process as well as with the testing equipment that uses the finished product. Template control holes 303 are punched through Mylar™ film template 304, using drill alignment die guide 302. Note drill alignment die guide 302 preferably has oil-light bronze bushings surrounding or encasing die guide holes 314. These bushings are comprised of a material that is more malleable than that of other materials used in drill alignment die guide 302. These bushings allow for a better fit of drill alignment die 301 and drill alignment die guide 302. Mylar™ film template 304 is securely affixed and secured over punch alignment holes 305 with double-sided tape in drill alignment die 301. Drill alignment die guide 302 is mounted to drill alignment die 301 by inserting die base guide pins 308 into die guide holes 314 of drill alignment die 301. At least one punch 330 is inserted through punch alignment holes 305 in drill alignment die guide 302 to punch a plurality of template control holes 303 out of Mylar™ film template 304. Note film template control holes 303 preferably form the corners of a square or diamond, but may create any number of desired shapes. The known relationship between template control holes 303 and the reference point 333 and probe guide holes 451 (shown on FIGS. 4A and 4C) is used as a reference throughout the entire manufacturing process to align additional assembly fixtures that are subsequently used in the manufacturing process. The reference point 333 can theoretically be located anywhere on the plane (or elsewhere) and the actual position could vary so long as it is known in space. As a practical matter, however, the spatial limits in which each pin can be located on each fixture is determined by the job specifications and particularly by the size of the device under test. Mylar™ film template 304 is then removed after drill alignment die guide 302 is lifted from die 301.

Figure 4A:
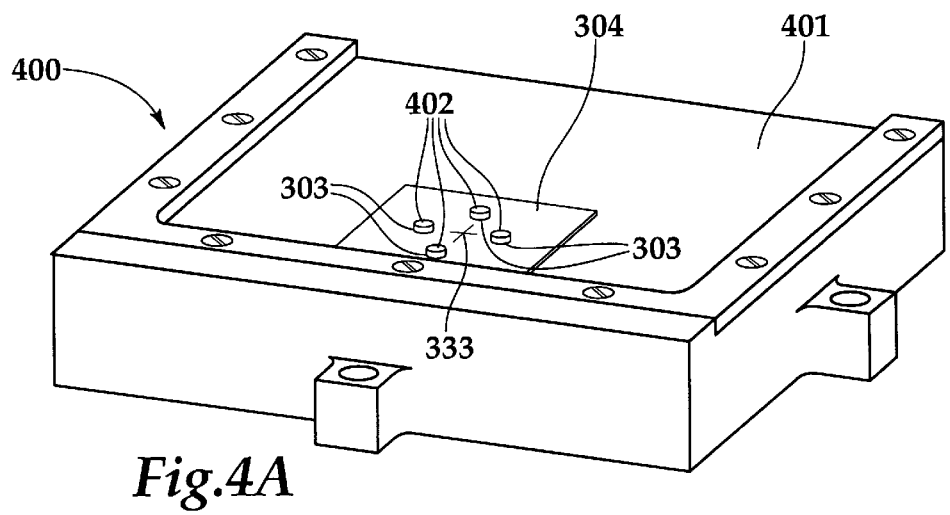
FIG. 4A is a perspective illustration of Mylar™ film template 304 positioned on drill alignment guide 400.

FIG. 4A is a perspective illustration of Mylar™ film template 304 positioned on drill alignment guide 400. This step is executed as per normal drilling or punching procedures. In preparation for drilling (or punching) probe guide holes 451 in Mylar™ film template 304, Mylar™ film template 304 is fitted to the drill alignment guide surface 401 in the required orientation by aligning template control pins 402 positioned on drill alignment guide 401 and extending therefrom. Template control pins 402 align with and correspond to template control holes 303 previously punched in Mylar™ film template 304, thereby maintaining the known relationship (which is fixed) with reference point 333. Template control pins 402 extend through film template control holes 303 to locate Mylar™ film template 304 in space. Once again, double sided tape is preferably used to secure Mylar™ film template 304 to drill alignment guide surface 401, but alternative techniques, such as a vacuum suction technique, could also be used. Probe guide holes 451 are drilled (or punched) into Mylar™ film template 304 at preset known coordinates, which are offset from reference point 333. Preset known coordinates are positioned from known relationship to template control holes 303 and template control pins 402. The positioning of probe guide holes 451 will naturally vary according to the design of each different microchip design to be tested. The location of probe guide holes 451 are either provided by the microchip manufacturer or created by digitizing the exact location of contact pads of each microchip on a semiconductor wafer, so that probe guide holes 451 can be drilled or punched in subsequent steps by a computer controlled drill or punching apparatus to provide a great degree of accuracy and automation.

Figure 4B:
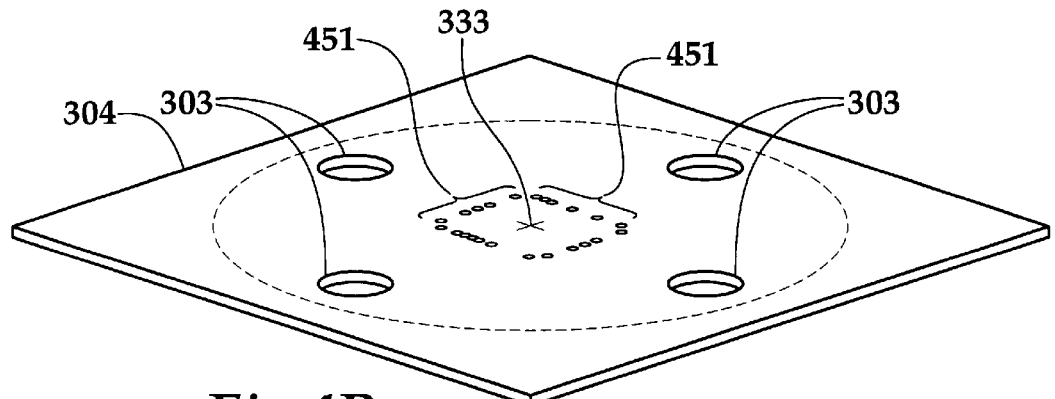
FIG. 4B is a perspective view of the top of Mylar™ film template 304 having alignment holes 303 in relation to known reference point 333 and probe guide holes 451.

FIG. 4B is a perspective view of the top of Mylar™ film template 304 having template control holes 303 in relation to reference point 333. As shown, reference point 333 is preferably positioned in the geometric center of a square formed by template control holes 303, but can be placed elsewhere. The coordinates of Mylar™ film template 304, probe guide holes 451, and reference point 333 and, thus, the distance of reference point 333 to template control holes 303 is known and fixed. As discussed above, template control holes 303 may be moved as can the reference point 333, so long as there is a known relationship and/or known offset between template control holes 303 and reference point 333. Template control holes 303 and reference point 333 calibrate the fixtures and other pieces forming the preferred embodiments of probe ring assembly 750, printed circuit board 800, and/or probe card assembly 950. Also, note that the actual shape of Mylar™ film template 304 can change throughout the manufacturing process or from application to application, as needs vary, so long as template control holes 303 and probe guide holes 451 continue to be used in a fixed relationship to one another or the location of probe guide holes 451 is known via template control holes 303. For instance, Mylar™ film template 304 could be cut in a circular pattern 307, such as shown along the dotted line in FIG. 4B. Alternatively, template control holes 303 could be used to set up another reference point(s), other than reference point 333, from which probe guide holes 451 are positioned or located. The location of probe guide holes 451 will vary as well in relation to the location of the contact pads on a single (or multiple) microchip(s) on a semiconductor wafer to be tested.

If these locations were not provided, they may be determined by aligning cross-hairs of and through a microscope that is focused over the center of the contact pads of the microchip. Preferred processes digitize the wafer contact pads of a single (or multiple) microchip (depending upon the job requirements). This digitization procedure comprises the following steps: positioning the wafer on a wafer chuck under microscope equipped with cross-hair eye-piece (the wafer chuck is mounted to motorized and computer controlled X-Y linear stages), adjusting the wafer rotation with thumb screw theta adjustment knob, so that when the stages are moved in either the X or the Y direction, no lateral motion of the wafer can be detected as verified with cross-hairs, positioning the wafer under the microscope, such that the cross-hair is on the corner of a single (or multiple) microchip, resetting digital readout on the computer to read 0 for X and Y axes, moving the X-Y stage, so that cross-hair is aligned with diagonally opposite corner of one or multiple chips and record the digital readout, moving back ½x and ½y to arrive at the center of the microchip and resetting the computer to read 0 for X and Y axes (this is reference point 333), and moving the wafer, so that the cross-hair is aligned over the center of each contact pad and record each X and Y coordinate, which is stored in memory and can be recalled.

Figure 4C:
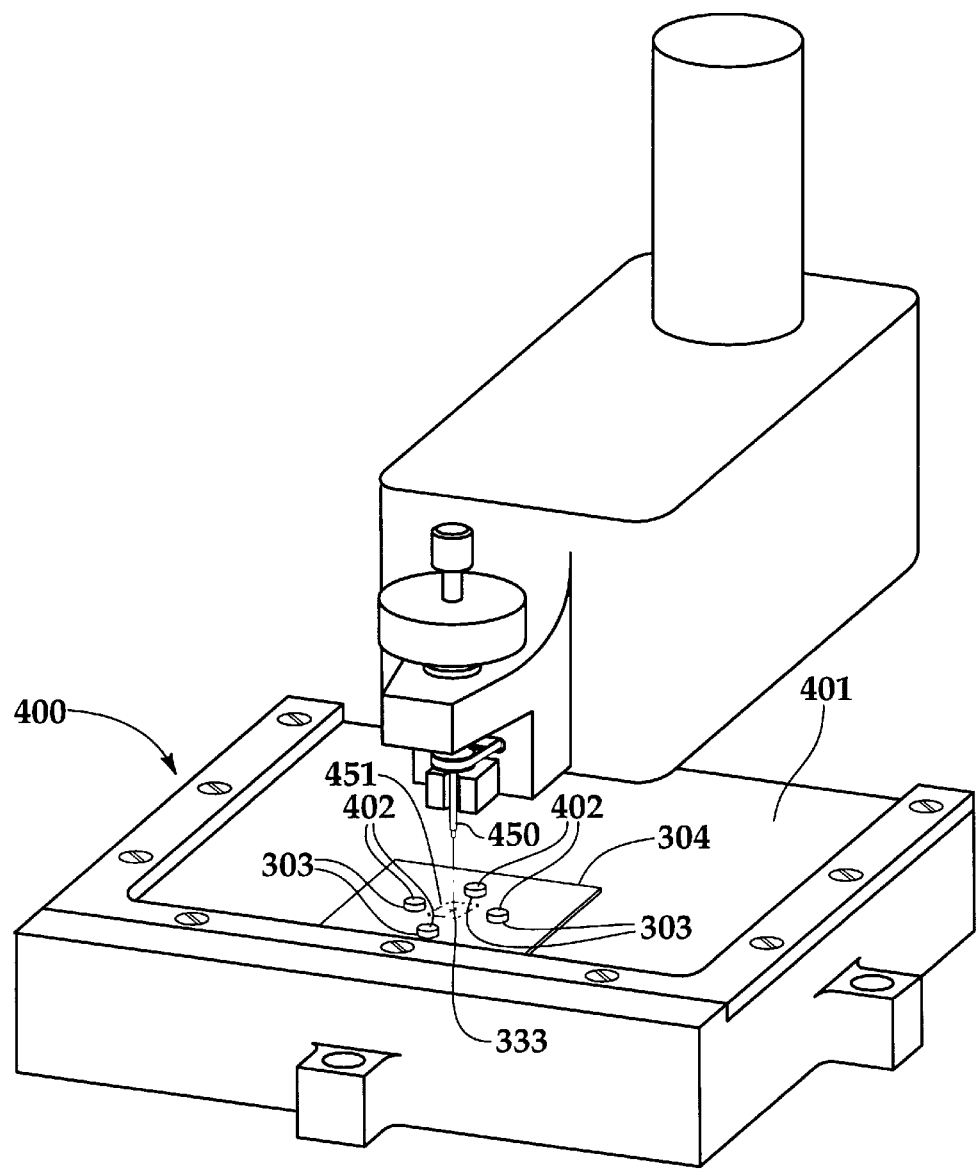
FIG. 4C is a perspective view of probe guide holes 451 being drilled into Mylar™ film template 304 by drill 450.

FIG. 4C is a perspective view showing probe guide holes 451 being drilled or punched into Mylar™ film template 304 by drill 450. The center of drill 450 is preferably aligned with reference 333. Reference point 333 is used by drill 450, which is preferably computerized, to locate the specified position of probe guide holes 451. The drill alignment guide 400 moves in the X, Y directions to align drill 450 in the proper position.

Figure 5:
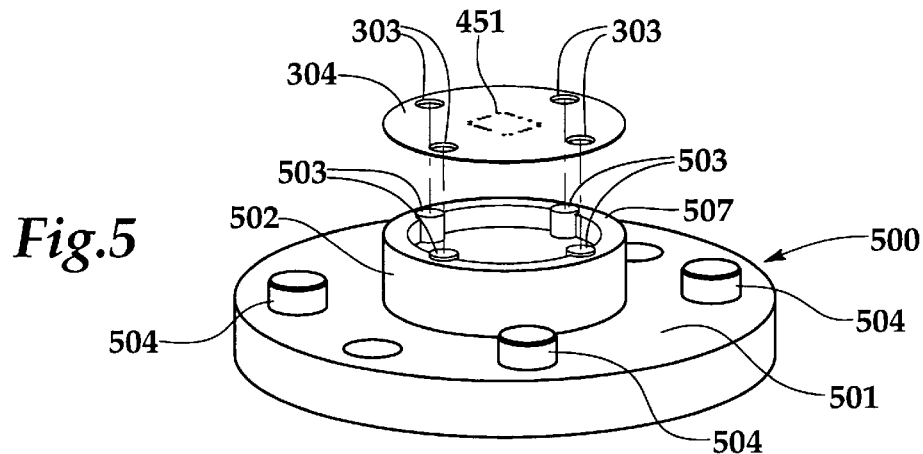
FIG. 5 is a perspective view of Mylar™ film template 304 positioned on, and aligned to, top of drum 502 of ring drop mold base 501.

FIG. 5 is a perspective view of Mylar™ film template 304 aligned to the top of ring drop drum 502 of ring drop base 501. Ring drop drum 502 and ring drop base 501 form ring drop base assembly 500. FIG. 5 illustrates the preferred implementation of the step of aligning Mylar™ film template 304 (after being cut into a circle) on ring drop base 501. Ring drop drum alignment pins 503 are positioned so as to align with template control holes 303 and extend through or into template control holes 303 of Mylar™ film template 304. Mylar™ film template 304 is cut to size and circular shape and then affixed to ring drop drum upper surface 507, which is circular in shape, of ring drop drum 502 of ring drop base 501 by fitting template control holes 303 in Mylar™ film template 304 to ring drop drum alignment pins 503 on the outer perimeter of ring drop drum 502. Note each probe 705 (not shown in FIG. 5—see FIG. 7A) has a contact end, which is be bent at an angle, to contact the particular contact pad of the microchip (not shown) being tested. Mylar™ film template 304 is secured to ring drop drum upper surface 507 any number of ways, such as with double-sided tape or contact cement adhesives. Ring drop base assembly 500 is then fit to ring drop mold 600 (in FIGS. 6A and 6B) by inserting ring drop drum 502 through ring drop mold center opening 604 in ring drop mold 600 and aligning ring drop mold alignment pins 503 with ring drop mold guide holes 605. Ring drop base assembly 500 uses ring drop guide pins 504 and ring drop mold guide holes 605 of ring drop mold 600 to maintain a fixed physical relationship between template control holes 303 and probe guide holes 451. Preferred embodiments use three ring drop guide pins 504 that extend from ring drop base 501. Ring drop guide pins 504 and ring drop drum alignment pins 503 are generally aligned in the same direction, but alternative embodiments are possible, so long as the relationship between the ring drop guide pins 504 and ring drop drum alignment pins 503 is fixed and can be computed. Note that it is important to maintain the fixed relationship between template control holes 303 of Mylar™ film template 304 and all other components that are sensitive to position, such as the probe guide holes 451, and, ultimately, to the location of probes 705 throughout the manufacturing process.

Figure 6A:
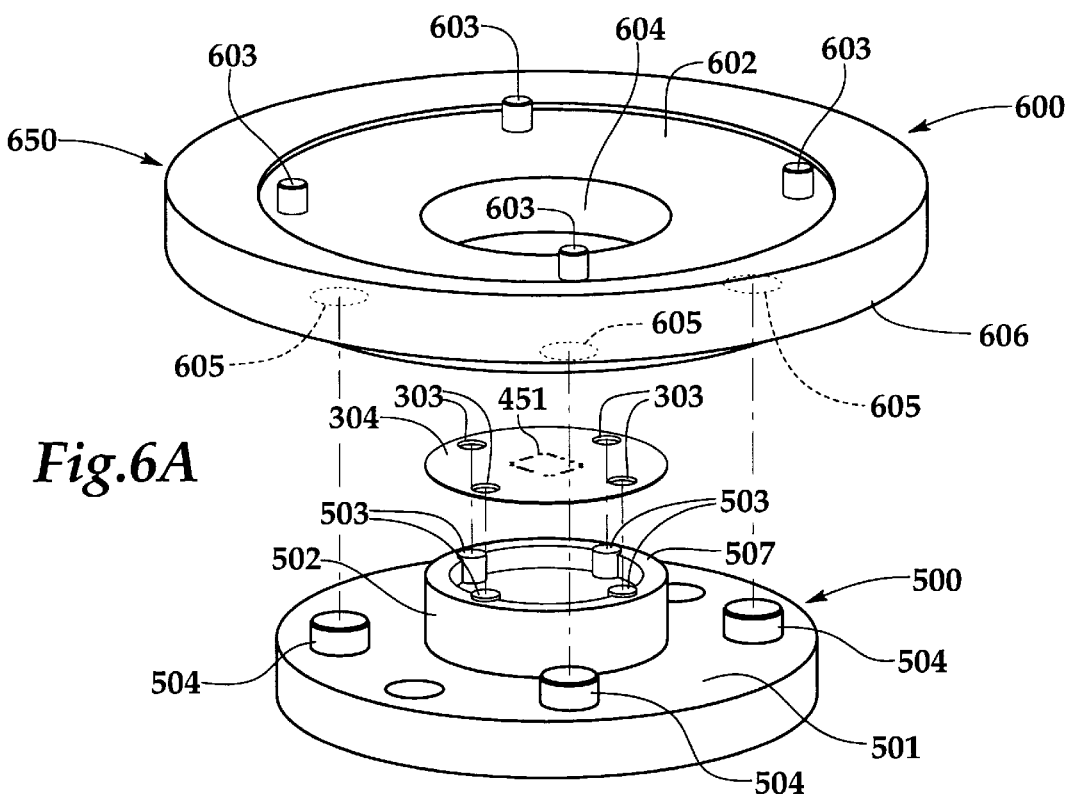
FIG. 6A is a perspective view of ring drop mold base assembly 500 being aligned to ring drop mold 600 to mount the ring drop mold 600 to ring drop mold base assembly 500.
Figure 6B:
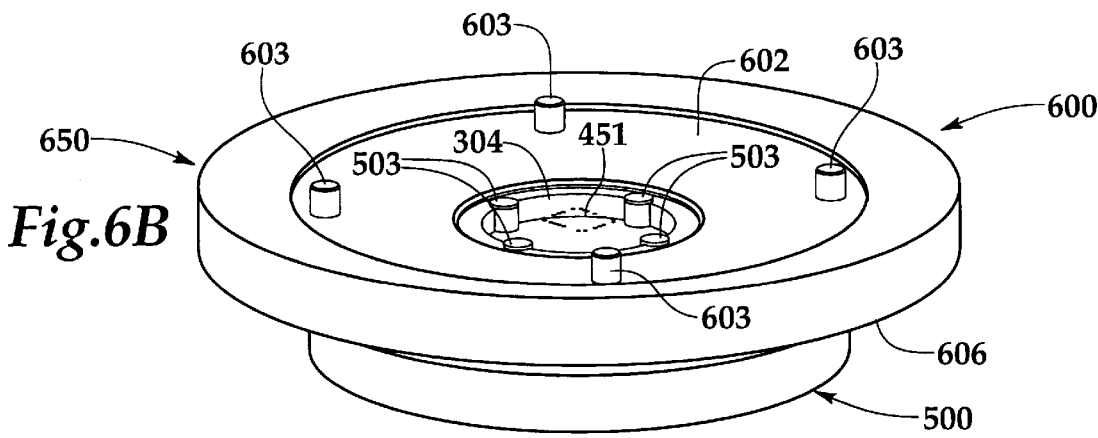
FIG. 6B shows the resulting ring drop assembly 650, created by the step shown in FIG. 6A.

FIG. 6A is a perspective view of ring drop base assembly 500 being aligned to ring drop mold 600 to mechanically couple ring drop mold 600 with ring drop base assembly 500. FIG. 6B shows the resulting assembly, ring drop assembly 650, created by the step shown in FIG. 6A. Ring drop base assembly 500 and ring drop mold 600 are complementary to one another and are mechanically coupled together as illustrated in FIG. 6B. The correct relationship between the two components is achieved through the use of ring drop guide pins 504 that align with ring drop guide holes 605 on the under side 606 of ring drop mold 600 and maintained by the mechanical coupling (via at least one screw) of ring drop base assembly 500 to ring drop mold 600. As a result, the position of probe guide holes 451 is maintained and known in space, which is important to reduce errors in future steps.

FIG. 7A is a perspective view of probe ring 700 being aligned to ring drop mold 600 (which was mounted to ring drop base assembly 500 in FIGS. 6B and 6A). FIGS. 7B (bottom view) and 7C (top view) are perspective views of probe ring assembly 750 created using the preferred process. The use of template control holes 303, as well as the subsequent use of alignment holes and pins (such as ring alignment plate control holes 1004 and ring alignment probe control pins 1008), maintains the known, fixed relationship between the bent tips of probes 705 and reference point 333. The precise location of probe guide holes 451 is known and fixed in space (i.e., in relation to reference point 333), so that when probe tips (not shown in FIG. 7A, because they are shielded by the Mylar™ film template 304) of probes 705 are inserted through probe guide holes 451, probe tips are precisely positioned in relation to reference point 333. Probes 705 are secured in position by aligning probe ring 700 to ring drop mold surface 602 and then bonding probe ring 700 to probes 705 with epoxy 719, but not to ring drop assembly 650. Probe ring 700 is aligned to ring drop assembly 650 by aligning probe ring alignment pins 603 located on the outer perimeter of the surface of the ring drop mold surface 602 being fit to the corresponding probe ring alignment holes 704 on the bottom surface of probe ring 700.

FIGS. 7B and 7C illustrate the preferred embodiment of probe ring assembly 750. The preferred embodiment of probe ring assembly 750 provides significantly greater relative positioning of the bent tips of probes 705 on the X, Y and theta (θ) axes when comparing unlimited numbers of probe card assemblies 750 of a given design with all other probe ring assemblies 750 of the same design. The use of the process described throughout this application to replicate the positioning of tips of probe 705 on probe ring assemblies 750 of a given design, and probe card assemblies 950 of a given design, within tolerances of ±0.002 inches on the X and Y axes and ±10 arc seconds on the theta (θ) axis is a unique characteristic of this process that distinguishes it from all other probe ring assembly and probe card assembly manufacturing processes.

FIG. 8A is a perspective view of ring alignment base 1001 being affixed to ring alignment plate 1002, which together form ring alignment base plate assembly 1000. Ring alignment base plate assembly 1000 is used to align and hold in place probe ring assembly 750 while it is being affixed to printed circuit board 800 (shown in FIGS. 8B and 8C). Note the continued use of alignment pins, such as ring alignment plate control pins 1008, that extend into or through and align with ring alignment plate control holes 1004, so that ring alignment base 1001 is fixed in a known position on ring alignment plate 1002, which, in turn, has a known relationship with the tips of each probe 705 of probe ring assembly 750. Note also ring alignment drum 1005, serving as a base for ring alignment drum control pins 1003, is affixed in a known position on ring alignment base 1001 and hence on ring alignment plate 1002. Screws 1006 are inserted through ring alignment base retaining holes 1007 of ring alignment base 1001 and into base screw holes 1010 of ring alignment plate 1002 to secure ring alignment base 1001 to ring alignment plate 1002 in a fixed, known relationship.

FIG. 8B is a perspective view of printed circuit board 800 being aligned to printed circuit board alignment plate 900 and of printed circuit board alignment plate 900 which, in turn, is being aligned to ring alignment base plate assembly 1000. Note, once again, the use of ring alignment plate pins 1009 which extend away from the ring alignment base plate assembly 1000 and insert into ring alignment plate control holes 906 of printed circuit board alignment plate 900. Similarly, printed circuit board control holes 803 of printed circuit board 800 align with printed circuit board alignment pins 904 to ensure the proper alignment of printed circuit board 800 with printed circuit board alignment plate 900. Note printed circuit board 800 of differing designs will have differing patterns, differing shapes, and and differing sizes, depending on the microchip that probe card assembly is designed to test and the testing equipment that probe card assembly 950 (in FIGS. 8D–8E) is designed to fit. The fixed geometrical relationship between template control holes 303 and printed circuit board control holes 803 have been established using analytic geometry techniques. In preparation for affixing probe ring assembly 750 to the printed circuit board 800 (in FIG. 8C), printed circuit board control holes 803 located on the outer perimeter of printed circuit board 800 are fitted to corresponding printed circuit board alignment pins 904 on the recessed inner rim of the printed circuit board 815 of the printed circuit board alignment plate 900. Ring alignment plate control holes 906 are then fitted to ring alignment plate pins 1009. Note solder contacts 804 are generally oriented in a "star-burst" pattern around printed circuit board opening 815 of printed circuit board 800 (preferably, but not necessarily, in the center of printed circuit board 800). Printed circuit board electrical contacts 806 are selectively electrically coupled to solder contacts 804 to permit access to various electrical connections used by various test equipment to test the microchip being tested via solder contacts 804 and probes 705 of probe ring assembly 750.

FIG. 8C is a perspective view of probe ring assembly 750 being aligned to printed circuit board 800 while printed circuit board alignment plate 900 is being aligned and assembled to ring alignment plate assembly 1000. Ring alignment plate assembly 1000 is aligned with printed circuit board alignment plate 900 with ring alignment plate pins 1009 and ring alignment plate control holes 906. Probe ring assembly 750 is aligned to printed circuit board alignment plate 900 as a consequence of printed circuit board alignment plate 900 mounted on ring alignment base plate assembly 1000. In particular, probe ring assembly 750 is aligned to ring alignment drum control pins 1003 on ring alignment drum 1005 of ring alignment base 1001. Note ring alignment control pins 1003 are offset, so that ring alignment base plate assembly 1000 and printed circuit board alignment plate 900 fit together in only one way and cannot be rotated. Ring alignment drum control pins 1003 of ring alignment drum 1005 extend through printed circuit board opening 815 and into ring holes 721 of probe ring assembly 750.

FIGS. 8D and 8E are perspective views of printed circuit board 800 combined with probe ring assembly 750 to form probe card assembly 950. FIG. 8D illustrates the relationship between ring holes 721 on the bottom of probe ring assembly 750 and ring alignment drum control pins 1003. FIG. 8E illustrates the bottom view of probe card assembly 950, resulting from the assembly of probe ring assembly 750 to printed circuit board 800.

Figure 9A:
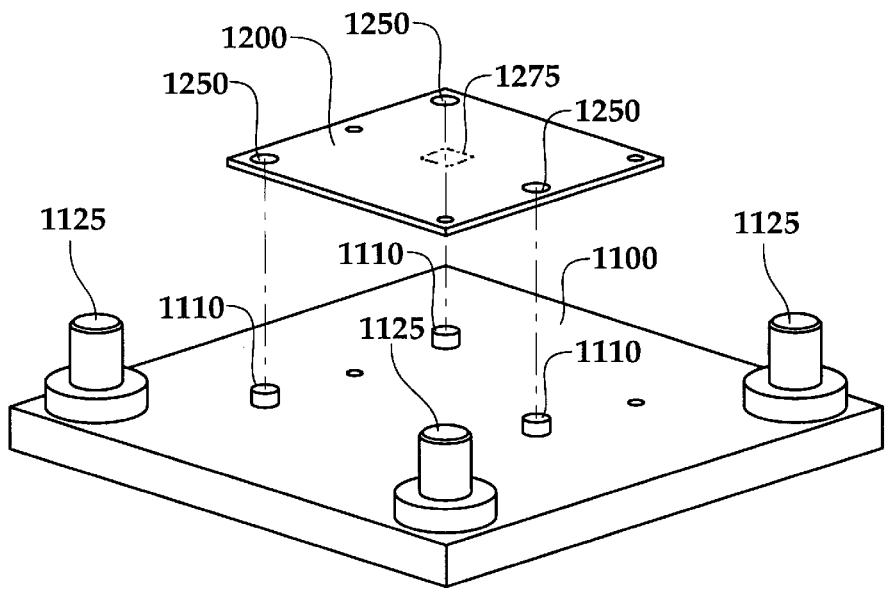
FIG. 9A is a perspective view of probe alignment template 1200 aligned to probe alignment base plate 1100.
Figure 9B:
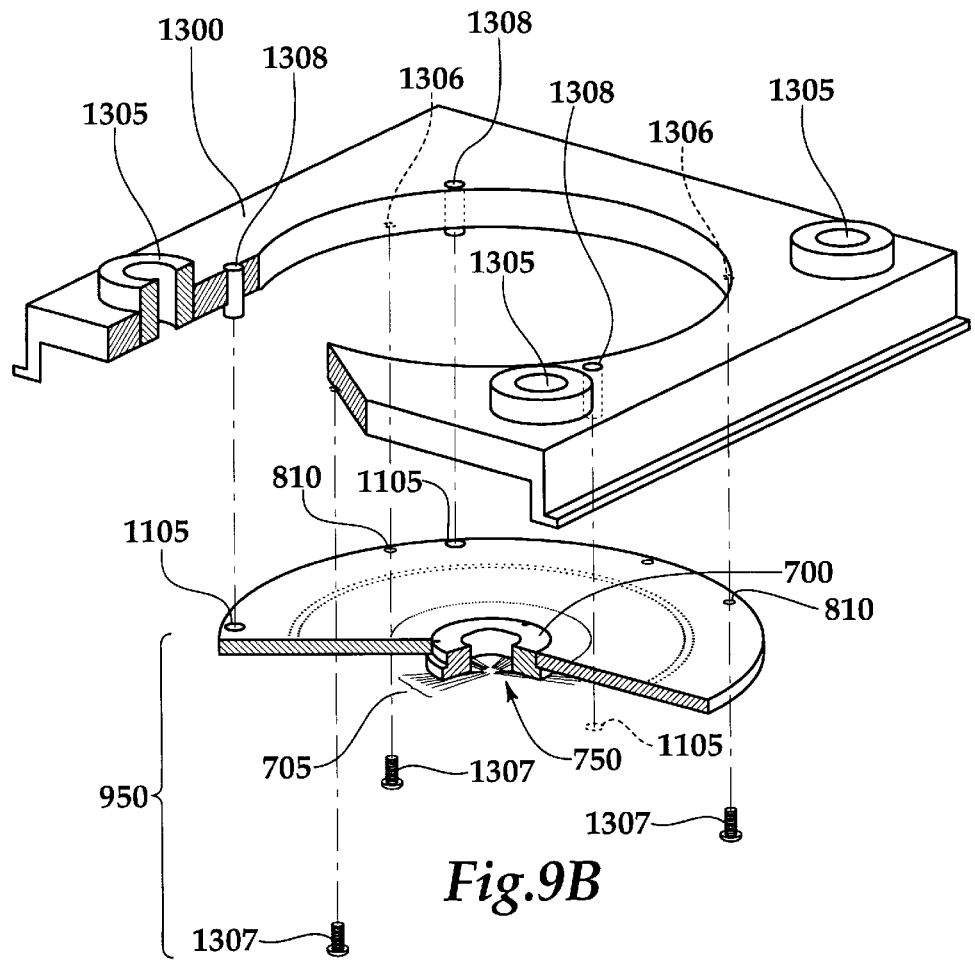
FIGS. 9B and 9C are perspective views of printed circuit board 800 together with probe ring assembly 750 aligned to probe alignment plate 1300.
Figures 9C, 9D:
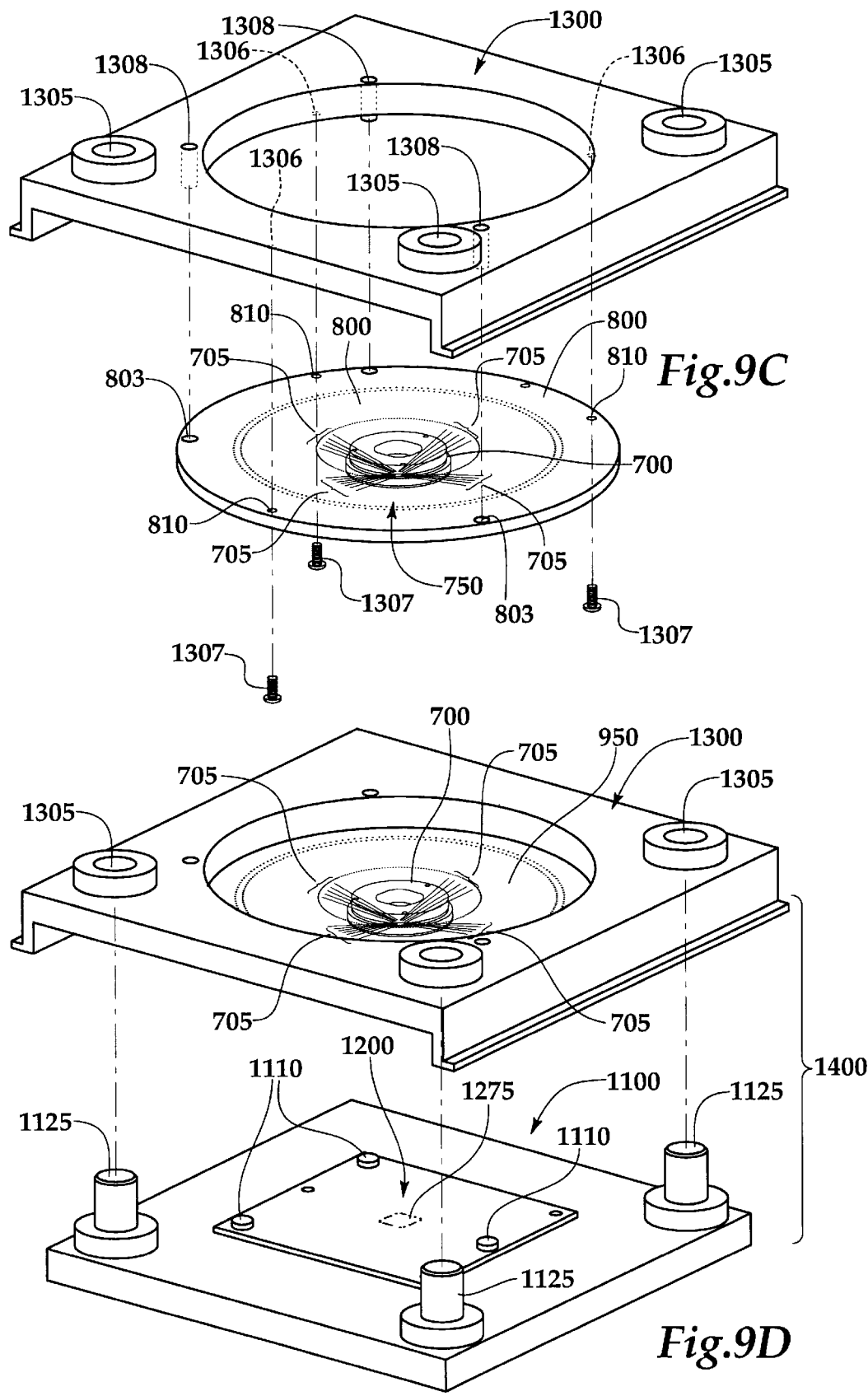
FIG. 9D is a perspective view of probe card 800 together with probe ring assembly 750 aligned to probe alignment plate 1300 and probe alignment base plate 1100.

FIG. 9A is a perspective view of probe alignment template 1200 aligned to probe alignment base plate 1100, which is the lower part of probe alignment assembly 1400 used to confirm the orientation and placement of probe(s) 705 of probe card assembly 950. FIGS. 9B and 9C are perspective views of probe card assembly 950 aligned to probe ring alignment plate 1300, which is the upper part of probe alignment assembly 1400 used to confirm the orientation and placement of probes 705 of probe card assembly 950. FIG. 9D is a perspective view of probe card assembly 950 affixed to probe ring alignment plate 1300 which, in turn, is aligned with probe alignment base plate 1100 to form probe alignment assembly 1400. FIGS. 9A, 9B, 9C and 9D illustrate the fixturing used in the step of verifying the correct alignment of the tip(s) of probe(s) 705 of probe card assembly 950. Probe target holes 1275 in probe alignment template 1200 are drilled in a material to emulate the target contact pad pattern on the microchip which probe(s) 705 must contact. Once again, there is a fixed and constant geometrical relationship between reference point 333 and the position of tips of probe(s) 705 and probe target holes 1275. Probe alignment template 1200 is fitted to probe alignment base plate 1100 by fitting template alignment holes 1250 in probe alignment template 1200 to template alignment pins 1110 of probe alignment base plate 1100. Once again, these holes and pins are precisely located within a fixed distance from the common independent reference point 333. Referring to FIGS. 9B and 9C, probe card assembly 950 is mounted to probe ring alignment plate 1300. Printed circuit board retaining screws 1307 are used to secure probe card assembly 950 to probe ring alignment plate 1300. Probe ring alignment plate 1300 has probe alignment assembly control holes 1305 to receive probe alignment assembly control pins 1125 thereby continuing the required geometrical relationship between reference point 333 and tips of probe(s) 705. Referring to FIG. 9C, probe ring alignment plate 1300 (with probe card assembly 950 secured thereto) is mounted to probe alignment base plate 1100 via probe alignment assembly control pins 1125 and probe alignment assembly control holes 1305. This step could be used to verify alignment of probe(s) 705 to probe target holes 1275 and to determine distant offsets (if any) from the actual location of probe 705 (X, Y & theta).

FURTHER MODIFICATIONS AND VARIATIONS

Although the invention has been described with reference to a specific embodiment, this description is not meant to be construed in a limiting sense. The example embodiments shown and described above are only as an example. Various modifications of the disclosed embodiment as well as alternate embodiments of the invention will become apparent to persons skilled in the art upon reference to the description of the invention. For instance, the preference of material for Mylar™ film template 304 may vary. In other words, alternate materials to Mylar™ can be chosen that still provide the desired properties of an alignment mechanism for the probes of the probe card. In addition, the location of pins and holes in certain cases can be swapped with one another, so that the current fixture having pins will have holes and the current fixture having holes will have pins. The pins may also extend through a hole or just into a hole. Similarly, while preferred embodiments use alignment pins and alignment holes to ensure the proper alignment, alternate methods to align the various pieces and fixtures could be used as well, such as optical alignment systems that shine light through one or more holes in fixtures and pieces and detected by photo sensors. Likewise, a printed circuit board may have more than one opening. Also, the ring drop base 500 could be combined with ring drop mold 600 along with ring drop mold 502 to form any number of working pieces. Thus, even though numerous characteristics and advantages of the present inventions have been set forth in the foregoing description, together with details of the structure and function of the inventions, the disclosure is illustrative only, and changes may be made in the detail, especially in matters of shape, size and arrangement of the parts within the principles of the inventions to the full extent indicated by the broad general meaning of the terms used in the attached claims. Accordingly, it should be understood that the modifications and variations suggested above and below are not intended to be exhaustive. These examples help show the scope of the inventive concepts, which are covered in the appended claims. The appended claims are intended to cover these modifications and alternate embodiments. In short, the restrictive description and drawings of the specific examples above are not intended to point out what an infringement of this patent would be, but are to provide at least one explanation of how to make and use the inventions contained herein. The limits of the inventions and the bounds of the patent protection are measured by and defined in the following claims.

What is claimed is:

1. An apparatus to test an integrated circuit, said integrated circuit having a plurality of contact pads electrically coupled to said integrated circuit to transfer electrical signals to and from said integrated circuit, comprising:

(a) a ring having a ring surface wherein said ring surface is non-conductive and is free of any conductive features on said ring surface, said ring having a ring opening to a hollow cavity extending through said ring, said ring surface substantially surrounding said ring opening, said ring having at least one defined, known, fixed, structural reference point affixed thereto, said at least one defined, known, fixed, structural point adapted to be structurally distinct from said ring surface, said at least one defined, known, fixed, structural reference point offset a first known distance from said plurality of contact pads and thereby establishes an overall, defined, known, common, fixed, geometric, reference point for said apparatus in relation to said plurality of contact pads; and (b) a plurality of probes positioned on said ring surface extending from a first location exterior to said ring to a second location proximate to said ring opening, said plurality of probes affixed to said ring surface, each probe of said plurality of probes having a contact end to contact one contact pad of said plurality of contact pads, each probe of said plurality of probes aligned in such a way so as to orient each contact end of each probe of said plurality of probes over said ring opening to contact one contact pad of said plurality of contact pads, each probe of said plurality of probes positioned a second known distance from said at least one defined, known, fixed, structural reference point, so that each probe of said plurality of probes is indirectly positioned a third known distance from said plurality of contact pads, and so that said at least one defined, known, fixed structural reference point, said ring, each probe of said plurality of probes, and said plurality of contact pads are positioned in a defined, known, fixed relationship with each other.

2. The apparatus of claim 1, further comprising:

(c) a printed circuit board having a second opening therein, said second opening having a second opening perimeter, said printed circuit board having a plurality of electrical contacts that contact said plurality of probes, said plurality of electrical contacts selectively electrically coupled said plurality of probes with testing equipment to test said integrated circuit, wherein said ring has a ring perimeter and wherein said second opening perimeter conforms to said ring perimeter, said ring aligns with said second opening.

3. The apparatus of claim 2, wherein said printed circuit board is round.

4. The apparatus of claim 2, wherein said printed circuit board aligns with said ring.

5. The apparatus of claim 4, further comprising a ring alignment base plate assembly and a printed circuit board alignment plate, said ring alignment base plate assembly interlocks with said printed circuit board alignment plate, said printed circuit board secured into a first position by said printed circuit board alignment plate, said ring secured in a second position in relation to said first position by said ring alignment base plate assembly.

6. The apparatus of claim 5, wherein said ring alignment base plate assembly has a plurality of base plate alignment pins that interlock with a plurality of printed circuit board alignment plate holes in said printed circuit board alignment plate and said ring alignment base plate assembly also having a plurality of ring alignment base plate drum alignment pins that align and interlock with a plurality of ring alignment holes in said ring.

7. The apparatus of claim 5, wherein said printed circuit board and said ring are secured in said first position and in said second position, respectively, such that said printed circuit board and said ring are aligned according to an X, Y axis within a tolerance of ±0.002 inches and aligned according to a theta (θ) axis within a tolerance of ±10 arc seconds.

8. The apparatus of claim 1, wherein said plurality of probes are affixed to said ring surface with epoxy, said epoxy electrically insulates said plurality of probes from one another.

9. The apparatus of claim 1, wherein said ring is non-conductive.

10. The apparatus of claim 1, wherein said ring is comprised of materials selected from a group consisting of ceramic, metal, epoxy, glass, and plastic.

11. The apparatus of claim 1, wherein said ring is substantially circular and comprised of stable, machinable material.

12. The apparatus of claim 1, wherein said opening is circular.

13. The apparatus of claim 1, wherein said ring has a reference hole and said reference hole in said ring is said at least one defined, known, fixed, structural reference point.

14. The apparatus of claim 1, wherein said ring has a first plurality of ring alignment holes that accept a plurality of ring drop mold surface alignment pins extending from a ring drop mold surface of a ring drop mold, said ring drop mold securing a film template in place, said film template having a plurality of probe guide holes and a plurality of film template alignment holes, said film template alignment holes at a known offset from said at least one defined, known, fixed, structural reference point and thereby at a second known offset from said plurality of contact pads, said plurality of probe guide holes at a third known offset from said at least one defined, known, fixed, structural reference point and thereby at a fourth known offset from said plurality of contact pads, said plurality of probe guide holes secure said plurality of probes in position while said plurality of probes are being affixed to said ring surface of said ring.

15. The apparatus of claim 14, wherein said ring drop mold is comprised of a first part and a second part, said first part and said second part interlock with one another.

16. The apparatus of claim 15, wherein said first part has a ring drop mold surface and a plurality of ring drop mold surface alignment pins extending from said ring drop mold surface into said first plurality of ring alignment holes of said ring, said second part having a second plurality of alignment holes to house said plurality of ring drop mold surface alignment pins of said first part, said first plurality of ring alignment holes constituting said at least one defined, known, fixed, structural reference point.

17. The apparatus of claim 1, wherein said ring is comprised of a first part and a second part, said first part interlocks with said second part, said first part having said ring surface.

18. The apparatus of claim 1, wherein said ring is comprised of a material selected from a group consisting of ceramic, epoxy, glass, and plastic.

19. The apparatus of claim 1, wherein said at least one defined, known, fixed, structural reference point is offset a first known direction from said plurality of contact pads of said integrated circuit, and each probe of said plurality of probes is also aligned in a second known direction from said at least one defined, known, fixed, structural reference point.

20. The apparatus of claim 1, wherein said at least one defined, known, fixed, structural reference point is fixed and easily duplicated from said ring to another ring substantially identical to said ring.

21. An apparatus to test an integrated circuit, said integrated circuit having a plurality of contact pads electrically coupled to said integrated circuit to transfer electrical signals to and from said integrated circuit, comprising:
 (a) a ring having a ring surface wherein said ring surface is non-conductive and is free of any conductive features on said ring surface, said ring having a ring opening to a hollow cavity extending through said ring, said ring surface substantially surrounding said ring opening;
 (b) a plurality of probes positioned on said ring surface extending from a first location exterior to said ring to a second location proximate to said ring opening, said plurality of probes affixed to said ring surface, each probe of said plurality of probes having a contact end to contact one contact pad of said plurality of contact pads, each probe of said plurality of probes aligned in such a way so as to orient each contact end of each probe of said plurality of probes over said ring opening to contact one contact pad of said plurality of contact pads; and
 (c) at least one defined, known, fixed, structural reference point for said ring and said plurality of probes, said at least one defined, fixed, structural reference point affixed to said ring, said at least one defined, known, fixed, structural reference point positioned a known distance from said plurality of contact pads, wherein each probe of said plurality of probes positioned a second known distance from said at least one defined, known, fixed, structural reference point, so that each probe of said plurality of probes is indirectly positioned a third known distance from said plurality of contact pads, and so that said at least one defined, known, fixed, structural reference point, said ring, each probe of said plurality of probes, and said plurality of contact pads are positioned in a defined, known, fixed relationship with each other.

22. The apparatus of claim 21, wherein said defined, known, fixed, structural reference point has at least one alignment hole affixed to said ring surface ring that accept a plurality of ring drop mold surface alignment pins extending from a ring drop mold surface of a ring drop mold.

23. The apparatus of claim 22, wherein said ring drop mold secures a film template in place, said film template having a plurality of probe guide holes and a plurality of film template alignment holes, said film template alignment holes at a known offset from said at least one defined, known, fixed, structural reference point and thereby at a second known offset from said plurality of contact pads, said plurality of probe guide holes at a third known offset from said at least one defined, known, fixed, structural reference point and thereby at a fourth known offset from said plurality of contact pads, said plurality of probe guide holes secure said plurality of probes in position while said plurality of probes are being affixed to said ring surface of said ring.

24. The apparatus of claim 21, wherein said at least one defined, known, fixed, structural reference point is offset a first known direction from said plurality of contact pads of said integrated circuit, and each probe of said plurality of probes is also aligned in a second known direction from said at least one defined, known, fixed, structural reference point.

25. An apparatus to test an integrated circuit, said integrated circuit having a contact pad electrically coupled to said integrated circuit to transfer electrical signals to and from said integrated circuit, comprising:
 (a) a ring having a ring surface wherein said surface is non-conductive and is free of any conductive features on said ring surface, said ring having a ring opening to a hollow cavity extending through said ring, said ring surface substantially surrounding said ring opening, said ring surface having an alignment hole therein, said alignment hole positioned a known distance from said contact pad; and
 (b) a probe affixed to said ring surface extending from a first location exterior to said ring to a second location proximate to said ring opening, said probe having a contact end to contact said contact pad, said probe affixed to said ring surface such that said contact end of said probe can selectively contact said contact pad of said integrated circuit when said integrated circuit is positioned over said ring opening, said probe positioned a second known distance from said alignment hole, so that said probe is indirectly positioned a third known distance from said contact pad, and so that said ring, said probe, and said contact pad are positioned in a defined, known, fixed relationship with each other.

26. The apparatus of claim 25, wherein said alignment hole accepts a ring drop mold surface alignment pin that extends from a ring drop mold surface of a ring drop mold.

27. The apparatus of claim 26, wherein said ring drop mold secures a film template in place, said film template having a probe guide hole and a film template alignment hole, said film template alignment hole positioned at a known offset from said alignment hole of said ring surface and thereby at a second known offset from said contact pad, said probe guide hole positioned at a third known offset from said alignment hole of said ring surface and thereby at a fourth known offset from said contact pad, said probe guide hole secures said probe in position while said probe are being affixed to said ring surface of said ring.

28. The apparatus of claim 25, wherein said alignment hole is offset a first known direction from said contact pad of said integrated circuit, and said probe is also aligned in a second known direction from said alignment hole.

29. The apparatus of claim 25, wherein said ring surface has a second alignment hole therein, said second alignment hole positioned a fourth known distance from said contact pad and further wherein said probe is positioned a fifth known distance from said second alignment hole.

30. The apparatus of claim 29, wherein said alignment hole is offset a first known direction from said contact pads of said integrated circuit, and said probe is also aligned in a second known direction from said alignment hole and further wherein said second alignment hole is offset a third known direction from said contact pad of said integrated circuit, and said probe is also aligned in a fourth known direction from said second alignment hole.

31. The apparatus of claim 29, wherein said alignment hole accepts a ring drop mold surface alignment pin that extends from a ring drop mold surface of a ring drop mold, said ring drop mold secures a film template in place, said film template having a probe guide hole and a film template alignment hole, said film template alignment hole positioned at a known offset from said alignment hole of said ring surface and thereby at a second known offset from said contact pad, said probe guide hole positioned at a third known offset from said alignment hole of said ring surface and thereby at a fourth known offset from said contact pad, said probe guide hole secures said probe in position while said probe are being affixed to said ring surface of said ring; and wherein said second alignment hole also accepts a second ring drop mold surface alignment pin that extends from a ring drop mold surface of a ring drop mold, said film template having a second probe guide hole and a second film template alignment hole, said second film template alignment hole positioned at a fifth known offset from said second alignment hole of said ring surface and thereby at a sixth known offset from said contact pad, said second probe guide hole positioned at a seventh known offset from said second alignment hole of said ring surface and thereby at a eighth known offset from said contact pad, said second probe guide hole secures said probe in position while said probe are being affixed to said ring surface of said ring.

\* \* \* \* \*